(12) United States Patent
Hori et al.

(10) Patent No.: US 6,262,444 B1
(45) Date of Patent: Jul. 17, 2001

(54) FIELD-EFFECT SEMICONDUCTOR DEVICE WITH A RECESS PROFILE

(75) Inventors: Yasuko Hori; Kazuhiko Onda, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/113,325

(22) Filed: Jul. 10, 1998

(30) Foreign Application Priority Data

Apr. 23, 1997 (JP) .................................................. 10-113947
Jul. 10, 1997 (JP) .................................................. 09-185196

(51) Int. Cl.$^7$ ...................... H01L 31/072; H01L 31/109; H01L 31/0328; H01L 31/0336
(52) U.S. Cl. .......................... 257/192; 257/194; 257/195; 438/172
(58) Field of Search .................................. 257/192, 194, 257/195; 438/172

(56) References Cited

U.S. PATENT DOCUMENTS

| 4,952,527 | * | 8/1990 | Calawa et al. ........................ 437/107 |
| 5,250,822 | * | 10/1993 | Sonoda et al. ........................ 257/194 |
| 5,391,899 | * | 2/1995 | Kohno ................................... 257/192 |
| 5,486,710 | * | 1/1996 | Kitano ................................... 257/192 |
| 5,641,977 | * | 6/1997 | Kanamori ............................. 257/192 |
| 5,831,295 | * | 11/1998 | Huang et al. ........................ 257/192 |

FOREIGN PATENT DOCUMENTS

| 54-12573 | 1/1979 | (JP) . |
| 57-211275 | 12/1982 | (JP) . |
| 62-213279 | 9/1987 | (JP) . |
| 62-229972 | 10/1987 | (JP) . |
| 62-296566 | 12/1987 | (JP) . |
| 1-183858 | 7/1989 | (JP) . |
| 5-29356 | 2/1993 | (JP) . |
| 5-206169 | 8/1993 | (JP) . |
| 5-211172 | 8/1993 | (JP) . |
| 7-94529 | 4/1995 | (JP) . |
| 8-274118 | 10/1996 | (JP) . |

* cited by examiner

*Primary Examiner*—William Mintel
(74) *Attorney, Agent, or Firm*—Sughrue, Mion, Zinn, Macpeak & Seas, PLLC

(57) ABSTRACT

By using the InGaAs layer in which the In composition is graded or varied by stages for the contact resistance reducing cap layer of the recess type compound semiconductor FET as well as using the selective etching to InAs and GaAs at the time of recess etching, the recess profile can be made curvilinear without increasing the number of processes, and occurrence of the concentration of the electric field can be thereby prevented, restriction of the high breakdown voltage value due to recess profile eliminated, and high breakdown voltage achieved.

7 Claims, 26 Drawing Sheets

BREAKDOWN VOLTAGE : $V_1$
BREAKDOWN VOLTAGE : $V_2$

FIELD-EFFECT SEMICONDUCTOR DEVICE WITH A RECESS PROFILE

BACKGROUND OF THE INVENTION

1. Field of the Invention

The present invention relates to a compound semiconductor field effect transistor and a manufacturing process thereof in which the cap layer for contact resistance reduction has a recess structure, and more specifically, a field effect transistor and a manufacturing process thereof for achieving high breakdown voltage.

2. Description of the Related Art

In the case of a field effect transistor (FET) with a recess structure, electrons are trapped on the surface by forming the passivation film or carrying out functions as FET, and the electric field concentrated portion moves from the drain edge of the gate to the recess edge on the drain side with a sharp angle. In the field effect transistor, there are avalanche effect and tunnel current from the electric field concentrated portion for factors to determine the reverse breakdown voltage characteristics between gate and drain. Consequently, in the case of the field effect transistor with a recess structure, the reverse breakdown voltage value is restricted by the recess edge, that is, the recess profile.

FIG. 1 is a schematic cross-sectional view showing the construction of the heterostructure FET of conventional FETs which have the GaAs cap layer. In FIG. 1, on the semi-insulating GaAs substrate 171, undoped GaAs buffer layer 172, undoped $Al_{0.3}Ga_{0.7}As$ heterostructure buffer layer 173, undoped GaAs channel layer 174, impurity doped $Al_{0.3}Ga_{0.7}As$ donor layer 175, and impurity doped GaAs contact resistance reducing cap layer 176 are laminated successively by the epitaxial growth process. And the impurity doped GaAs contact resistance reducing cap layer 176 is shaved by recess-etching, and thereafter, a gate electrode 177 is formed on the impurity doped $Al_{0.3}Ga_{0.7}As$ donor layer 175, and source and drain electrodes 178, 179 are formed on the cap layer 176.

FIG. 2 shows the potential distribution when voltage is applied to the conventional FET, while FIG. 3 shows the voltage resistance characteristics. In general, when the passivation film is formed, or functions as FET are being carried out, it is known that electrons are trapped on the semiconductor surface or semiconductor/passivation film interface. It is known that by this electron capture, the potential which has the surface condition liable to be influenced changes and the electric field concentrated portion moves not to the gate edge between the gate and the drain but to the drain side.

As shown in FIG. 2, the potential distribution 810 moved to the drain side is concentrated to the recess edge on the drain side with an obtuse angle or acute angle formed from the surface of the impurity doped $Al_{0.3}Ga_{0.7}As$ donor layer 175 to which the gate electrode is arranged and the side of the impurity doped GaAs contact resistance reducing cap layer 176. Consequently, the reverse breakdown voltage value that serves as a major factor for determining the potential distribution is determined on the recess edge on the drain side.

However, since in the FET shown in FIGS. 1 through 3, the recess edge on the drain side has either an acute or obtuse profile, the electric field distribution moved to the drain side is concentrated at the recess edge with this angle. Consequently, avalanche yield occurs at this recess edge and the reverse breakdown voltage value is determined. That is, the conventional FET has a problem of restricting the breakdown voltage characteristics by the recess edge on the drain side with the angle formed from the semiconductor surface which comes in contact with the side surface of the contact resistance reducing cap layer at the gate electrode. In addition, carrying out equivalent etching at both edges of the drain side and the source side increases resistance on the source side, and as a result, FET characteristics may be degraded.

SUMMARY OF THE INVENTION

It is an object of this invention to provide a field effect transistor and the manufacturing process thereof, which can alleviate the concentration of the electric field caused by the recess edge profile, that is, restrict the avalanche yield, and improve the breakdown voltage characteristics without degrading the source resistance by making the recess profile a gently curvilinear form and eliminating angles, particularly by making the recess profile on the drain side to which the electric field is applied a gently curvilinear form and eliminating angles as compared to the recess profile on the source side.

In this invention, because the recess edge profile has angles which result in the concentration of an electric field, when the cross section is seen in FIG. 1, as a contact resistance reducing cap layer that forms a recess in a recess structure type compound semiconductor, it is an important objective of this invention to make the recess have a profile for avoiding the concentration; that is, the object can be achieved by making the recess profile curvilinear. A specific method to achieve this construction is to use a layer which has a composition subject to etching at least from the bottom portion towards the surface side for a contact resistance reducing cap layer, which is etched in the recess etching process, and for example, as one embodiment, the In composition is increased from the relevant contact resistance reducing cap layer bottom portion towards the surface side, the In graded layer in which the In composition is reduced again or the InGaAs layer in which the In composition varies stepwise is further formed by an epitaxial process or In ion implantation near the top layer as required, and the In graded layer has the recess edge formed curvilinearly using selective etching with a higher etching rate on InAs than on GaAs.

In this invention, for example, for a contact resistance reducing cap layer that forms the recess profile in the recess structure type compound semiconductor, the In composition is increased from the bottom portion of the relevant contact resistance reducing cap layer towards the surface side, and the In graded layer in which the In composition is reduced again or an InGaAs layer in which the In composition varies stepwise is formed by the epitaxial process or by In ion implantation in the vicinity of the top most surface. In addition, using selective etching which provides higher etching rate on InAs than on GaAs, the InGaAs contact resistance reducing cap layer can have the recess edge comprising a flat surface without acute or obtuse angles easily in the etching process, for example, only one etching process. As a result, because the recess edge angle on the drain side to which the electric field is concentrated can be eliminated, the high-breakdown voltage characteristics can be improved without having the reverse high-breakdown voltage value restricted by the recess profile.

In this invention, a recess profile which gently curves on the drain side as compared to the source side by one etching process through ion-implanting, for example, In once or in several portions into the contact resistance reducing cap layer that forms the recess profile in, for example, recess structure compound semiconductor. That is, by using the selective etching with a higher etching rate on InAs than on GaAs, the GaAs contact resistance reducing cap layer with this In ion implantation applied can be formed in a curvilinear profile comprising a flat recess edge free of acute or obtuse angles easily in one etching process. As a result, since the angle of the recess edge on the drain side to which the electric field is concentrated, the breakdown voltage characteristics can be improved without restricting the reverse breakdown voltage value due to the recess profile. In addition, because on the source side, the profile is not so much hollowed out than that on the drain side, it is possible to suppress degradation of the source resistance.

DETAILED DESCRIPTION OF THE PREFERRED EMBODIMENTS

Figure 1:
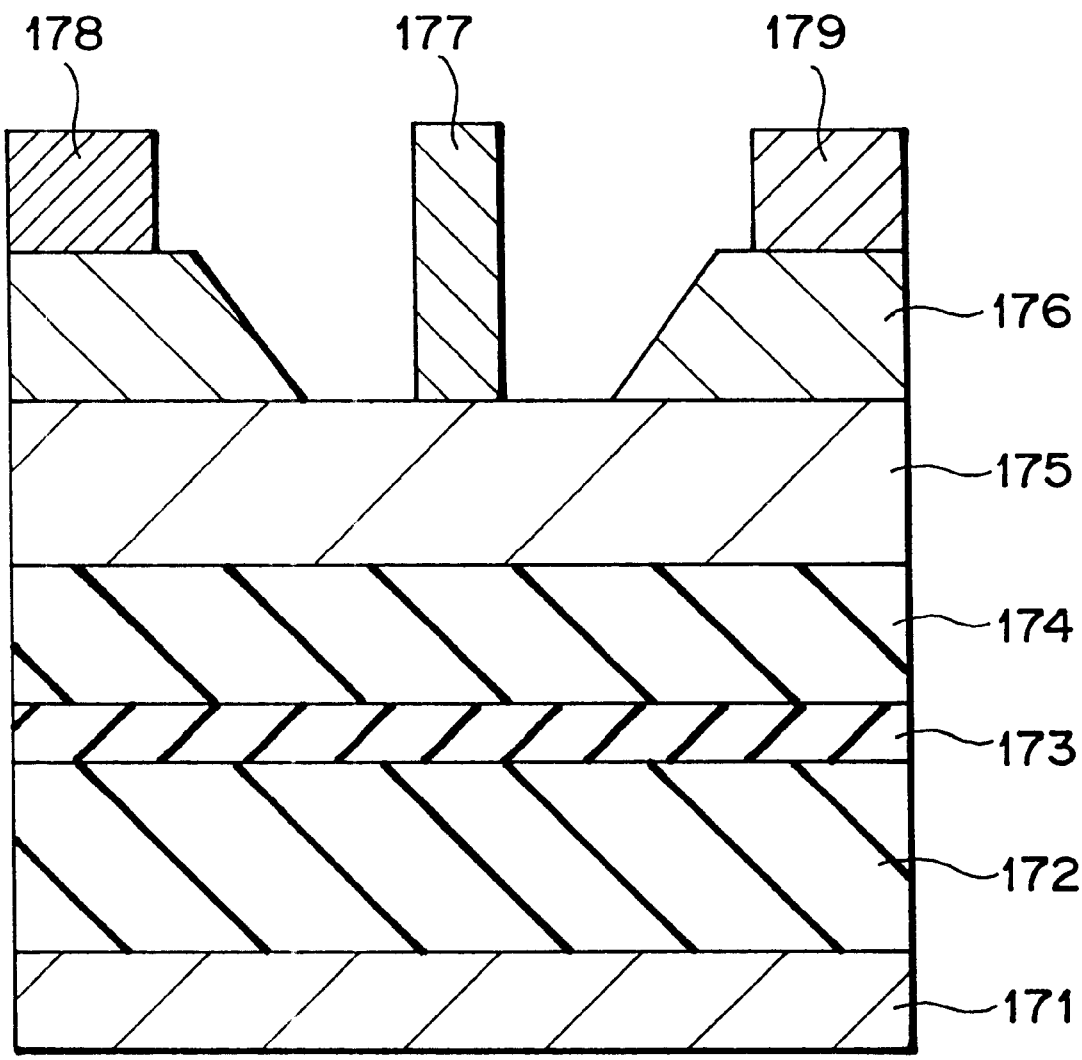
FIG. 1 is a cross-sectional view of an element showing a conventional FET.
Figure 2:
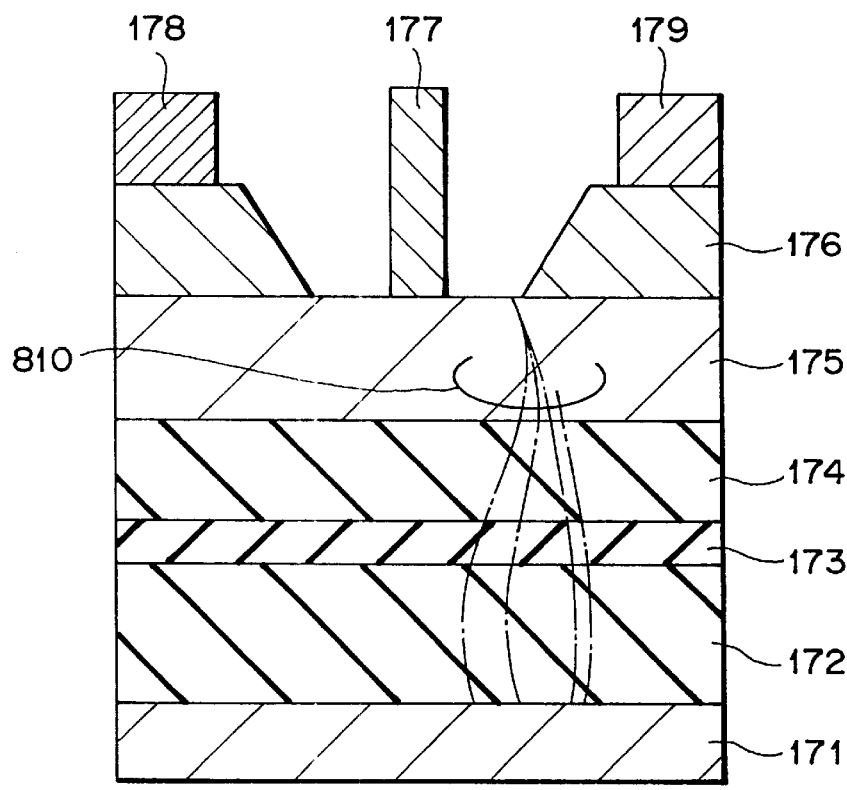
FIG. 2 is a gate to drain breakdown characteristics when conventional FET is operated.
Figure 3:
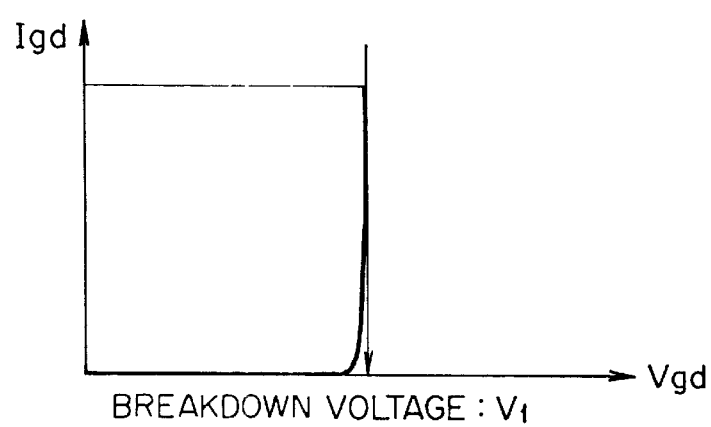
FIG. 3 is a breakdown voltage waveform diagram of the conventional FET.

Referring now to the drawings, preferred embodiments according to the present invention will be described in detail hereinafter.

(First Embodiment)

Here, as one example, an embodiment of a GaAs heterostructure FET will be described, but this invention shall not be limited to FET of this material system or structure. By this embodiment, it becomes possible to form the recess profile into a curvilinear profile by one etching process and to achieve high breakdown voltage.

Figure 4:
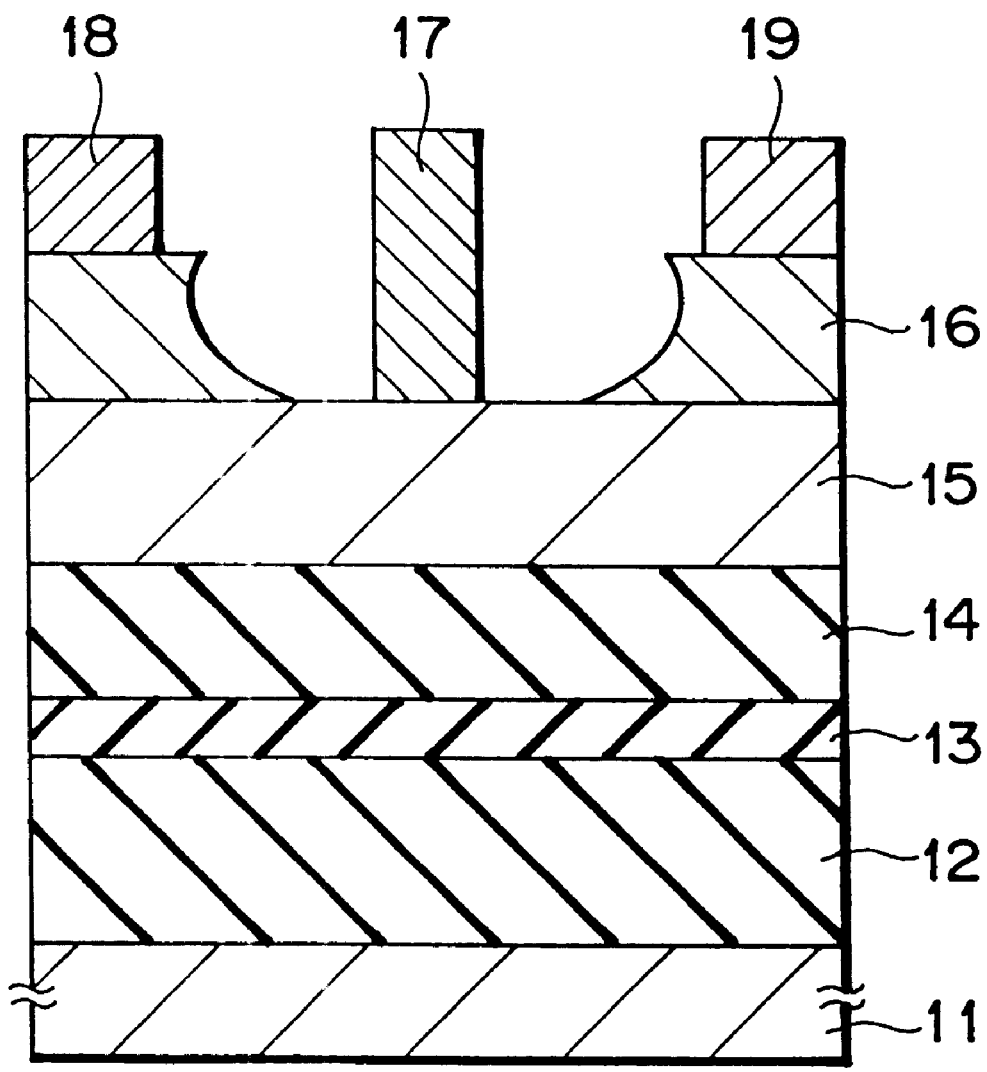
FIG. 4 is a cross-sectional view showing an element construction of the embodiment of GaAs-based FET according to this invention.

FIG. 4 shows a cross-sectional view of the element of the embodiment according to this invention.

As shown in FIG. 4, an undoped GaAs buffer layer 12, an undoped $Al_{0.3}Ga_{0.7}As$ heterostructure buffer layer 13, an undoped GaAs channel layer 14, an impurity doped $Al_{0.3}Ga_{0.7}As$ donor layer 15, and an impurity doped InGaAs graded contact resistance reducing cap layer (100 nm of thickness) 16 are formed by epitaxial growth on a semi-insulating GaAs substrate 11.

Now, the In composition of the impurity doped InGaAs graded contact resistance reducing cap layer 16 has a profile in which the In composition is increased from 0 to 0.3 in the graded manner in the 50 nm thickness from the bottom portion towards the surface side, then, in the following 15 nm thickness, the In composition is held to 0.3, and in the remaining 35 nm thickness near the surface, the In composition is returned from 0.3 to 0.

Next, the source and the drain electrodes 18, 19 comprising ohmic contact metal are formed on the grown substrate surface by the lift-off process, etc., and the impurity doped InGaAs graded contact resistance reducing cap layer 16 is partially etched to be removed between the relevant source and the drain electrodes 18 and 19, and on this place, the metal Schottky Functioned to the relevant donor layer is formed as a gate electrode 17.

When this cap layer 16 is etched, that is, the recess is etched, the etchant, for example, hydrochloric acid based etchant, which enables selective etching with a higher etching rate on InAs than on GaAs is used. As a result, the gate deposited surface, that is, AlGaAs layer, can be processed flat as in the case of the ordinary recess surface, and at the same time, the recess edge can be formed into a curvilinear profile free of angles in one etching process because the In composition is varied in the graded manner.

Figure 5A:
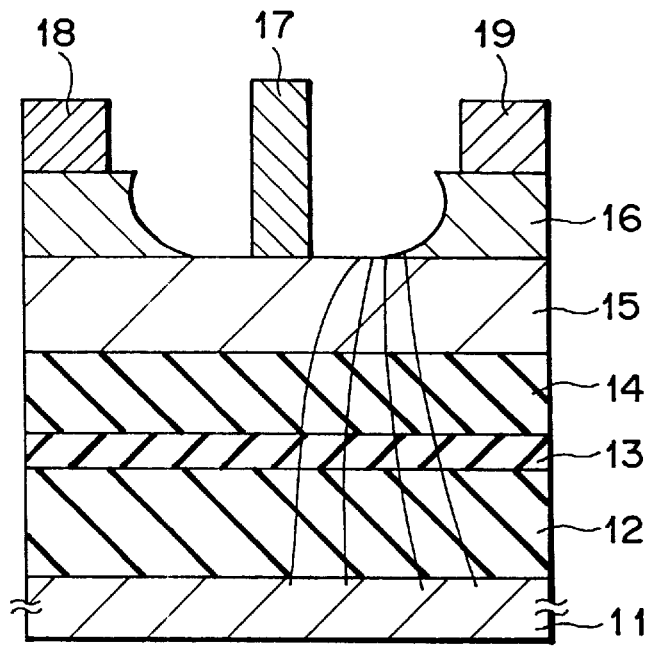
FIGS. 5A and 5B are potential distribution diagram and gate to drain breakdown (Igd–Vgd) characteristics, respectively, when functions as FET are executed in FIG. 4.
Figure 5B:
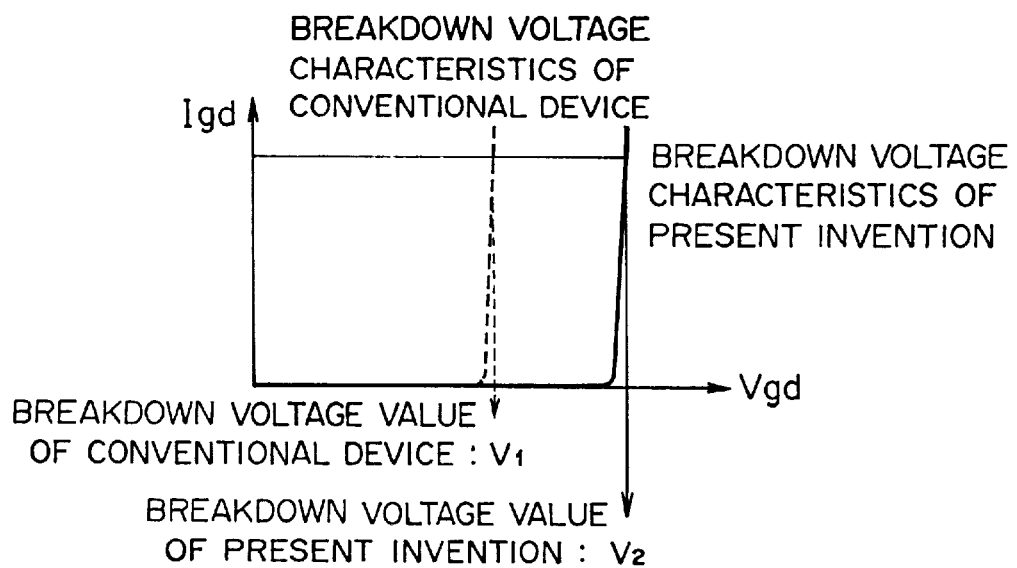

As a result, as shown in FIG. 5A, because the concentration of the electric field is eliminated in the recess profile, improvement in high breakdown voltage can be achieved as shown in FIG. 5B without being restricted by the recess edge on the drain side.

Here, as one example, the case of the AlGaAs/GaAs heterostructure FET is described, but this invention shall not be limited to this but can be applied to any FET which can use InGaAs for the cap layer. In addition, the thickness and composition of the InGaAs layer can be freely chosen. For the selective etchant, the hydrochloric acid based etchant is used, but the invention shall not be limited to this but can be applied to any etchant or gas which has a selectivity to InAs and GaAs.

(Second Embodiment)

Here, as one example, an embodiment of InP heterostructure FET will be described, but this invention shall not be limited to FET of this material system or structure. By this embodiment, it becomes possible to form the recess profile into a curvilinear profile by one etching process and to achieve high breakdown voltage.

Figure 6:
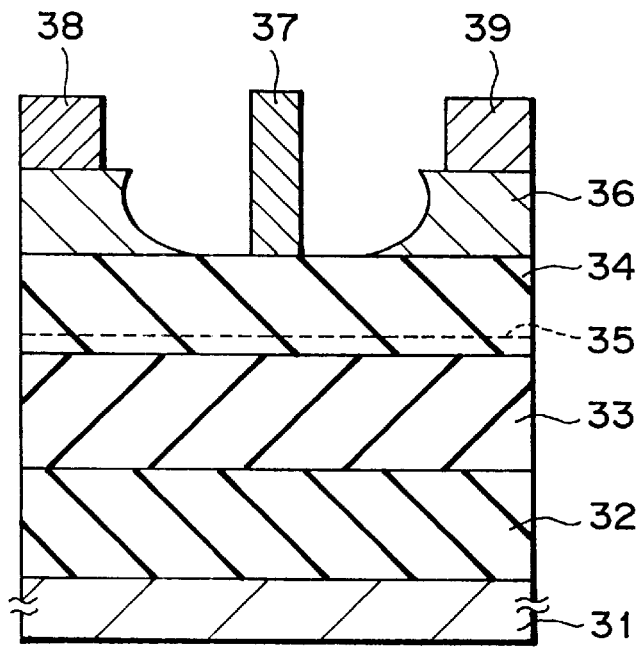
FIG. 6 is a cross-sectional view showing an element construction of the embodiment of an InP-based FET according to this invention.

FIG. 6 shows a cross-sectional view of the element of the embodiment according to this invention.

As shown in FIG. 6, an undoped $In_{0.48}Al_{0.52}As$ buffer layer 32, an undoped $In_{0.53}Ga_{0.47}As$ channel layer 33, an undoped $In_{0.48}A_{0.52}As$ donor layer 34, a Si planar dope 35, and an impurity doped InGaAs graded contact resistance reducing cap layer (50 nm of thickness) 36 are formed by epitaxial growth on a semi-insulating InP substrate 31.

Now, the In composition of the impurity doped InGaAs graded contact resistance reducing cap layer 36 has a profile in which the In composition is increased from 0.5 to 0.8 in the graded manner in the 25 nm thickness from the bottom portion towards the surface side, then, in the following 8 nm thickness, the In composition is held to 0.8, and in the remaining 17 nm thickness near the surface, the In composition is returned from 0.8 to 0.5.

Figure 7:
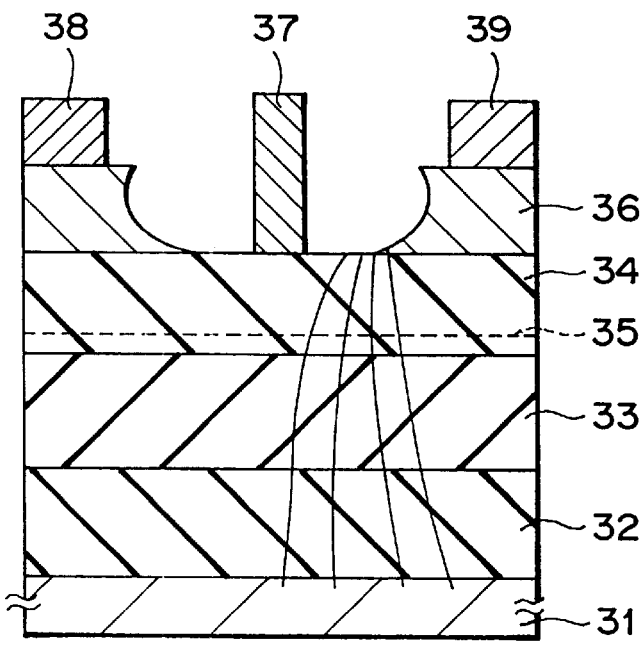
FIG. 7 is a potential distribution diagram when functions as FET are executed in FIG. 6.

Next, the source and the drain electrodes 38, 39 comprising ohmic contact metal are formed on the grown substrate surface by the lift-off process, etc., and the impurity doped InGaAs graded contact resistance reducing cap layer 36 is partially etched to be removed between the relevant source and the drain electrodes 38 and 39, and on this place, the metal Schottky Functioned to the relevant donor layer is formed as a gate electrode 37. When this cap layer 36 is etched, that is, the recess is etched, the etchant, for example, hydrochloric acid based etchant, which enables selective etching with a higher etching rate on InAs than on GaAs is used. As a result, the gate deposited surface, that is, InAlAs layer, can be processed flat as in the case of the ordinary recess surface, and at the same time, the recess edge can be formed into a curvilinear profile free of angles in one etching process because the In composition is varied in the graded manner. As a result, as shown in FIG. 7, because the concentration of the electric field is eliminated in the recess profile, improvement in high breakdown voltage can be achieved as shown in FIG. 5B without being restricted by the recess edge on the drain side.

Here, as one example, the case of the InAlAs/GaAs planar doped heterostructure FET is described, but this invention shall not be limited to this but can be applied to any FET which can use InGaAs for the cap layer. In addition, the thickness and composition of the InGaAs layer can be freely chosen. For the selective etchant, the hydrochloric acid based etchant is used, but the invention shall not be limited to this but can be applied to any etchant or gas which has a selectivity to InAs and GaAs.

(Third Embodiment)

Here, as one example, an embodiment of a GaAs heterostructure FET will be described, but this invention shall not be limited to FET of this material system or structure. By this embodiment, it becomes possible to form the recess profile into a curvilinear profile by one etching process and to achieve high breakdown voltage.

Figure 8:
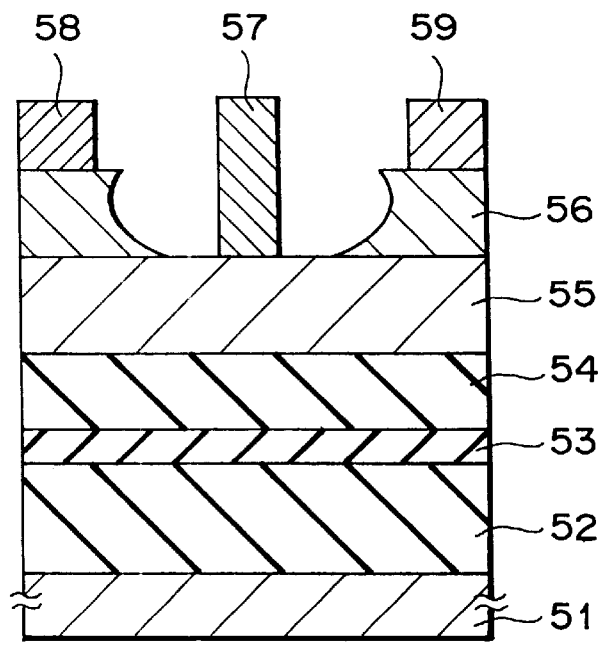
FIG. 8 is a cross-sectional view showing an element construction of the embodiment of a GaAs-based FET according to the invention.

FIG. 8 shows a cross-sectional view of the element of the embodiment according to this invention.

As shown in FIG. 8, an undoped GaAs buffer layer 52, an undoped $Al_{0.3}Ga_{0.7}As$ heterostructure buffer layer 53, an undoped GaAs channel layer 54, an impurity doped $Al_{0.3}Ga_{0.7}As$ donor layer 55, and an impurity doped In ion implanted GaAs contact 56 resistance reducing cap layer are formed by epitaxial growth on a semi-insulating GaAs substrate 51.

Now, the In composition of the impurity doped GaAs contact resistance reducing cap layer 56 has a profile in which the In composition is increased in the graded manner from the bottom portion towards the surface side by In ion implantation and on the topmost surface side, the In composition is lowered again.

Next, the source and the drain electrodes 58, 59 comprising ohmic contact metal are formed on the grown substrate surface by the lift-off process, etc., and the impurity doped InGaAs graded contact resistance reducing cap layer 56 is partially etched to be removed between the relevant source and the drain electrodes 58 and 59, and on this place, the metal Schottky Functioned to the relevant donor layer is formed as a gate electrode 57.

Figure 9:
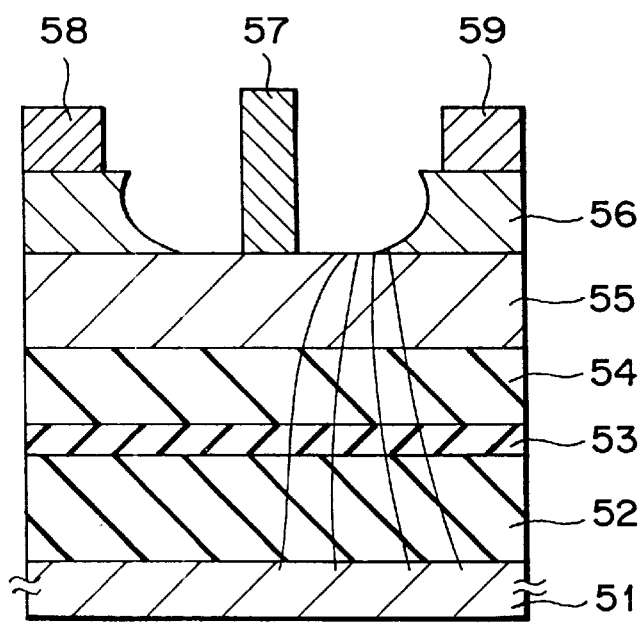
FIG. 9 is a potential distribution diagram when functions as FET are executed in FIG. 8.

When this cap layer 56 is etched, that is, the recess is etched, the etchant, for example, hydrochloric acid based etchant, which enables selective etching with a higher etching rate on InAs than on GaAs is used. As a result, the gate deposited surface, that is, AlGaAs layer, can be processed flat as in the case of the ordinary recess surface, and at the same time, the recess edge can be formed into a curvilinear profile free of angles in one etching process because the In composition is varied in the graded manner. As a result, as shown in FIG. 9, because the concentration of the electric field is eliminated in the recess profile, improvement in high breakdown voltage can be achieved as shown in FIG. 7B without being restricted by the recess edge on the drain side.

Here, as one example, the case of the AlGaAs/GaAs heterostructure FET is described, but this invention shall not be limited to this but can be applied to any FET which can use InGaAs for the cap layer. For the selective etchant, the hydrochloric acid based etchant is used, but the invention shall not be limited to this but can be applied to any etchant or gas which has a selectivity to InAs and GaAs.

(Fourth Embodiment)

Here, as one example, an embodiment of InP heterostructure FET will be described, but this invention shall not be limited to FET of this material system or structure. By this embodiment, it becomes possible to form the recess profile into a curvilinear profile by one etching process and to achieve high breakdown voltage.

Figure 10:
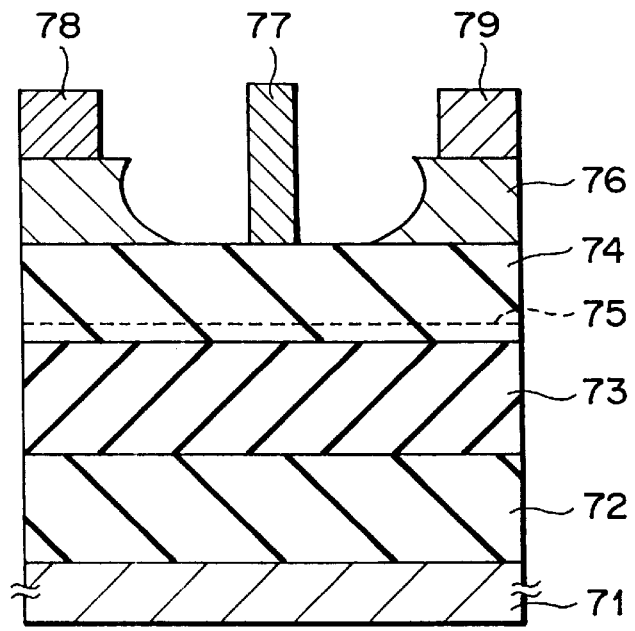
FIG. 10 is a cross-sectional view showing an element construction of the embodiment of InP-based FET according to this invention.

FIG. 10 shows a cross-sectional view of the element of the embodiment according to this invention.

As shown in FIG. 10, an undoped $In_{0.48}Al_{0.52}As$ buffer layer 72, an undoped $In_{0.53}Al_{0.47}As$ channel layer 73, an undoped $In_{0.48}Al_{0.52}As$ donor layer 74, an Si planar dope 75, an impurity doped In ion implanted GaAs contact resistance reducing cap layer 76 are formed by epitaxial growth on a semi-insulating InP substrate 71.

Now, the In composition of the impurity doped InGaAs graded contact resistance reducing cap layer 76 has a profile in which the In composition is increased in the graded manner from the bottom portion towards the surface side, and on the topmost surface side, the In composition is again returned to a low level.

Figure 11:
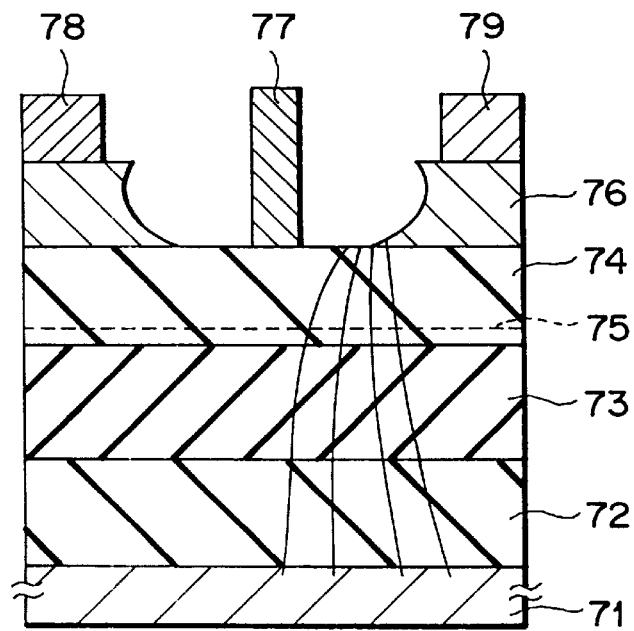
FIG. 11 is a potential distribution diagram when functions as FET are executed in FIG. 10.
Figure 12:
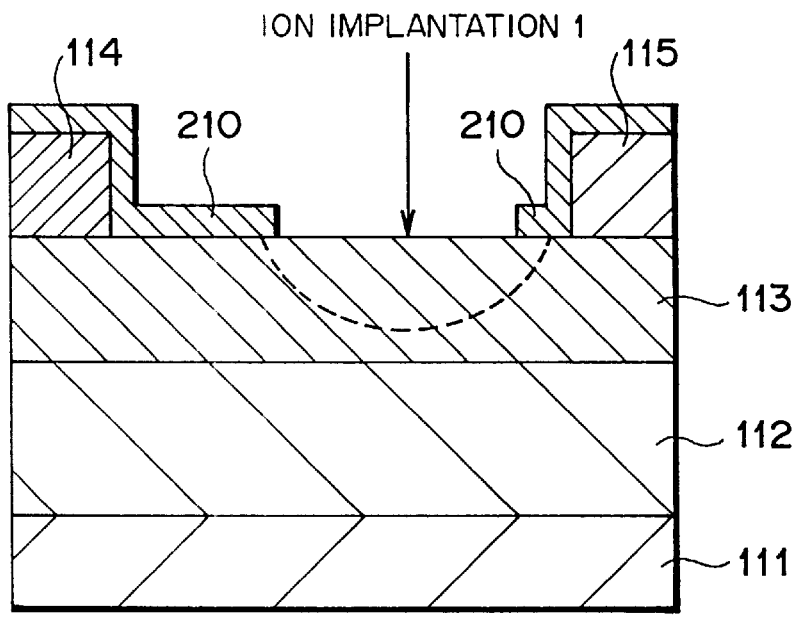
FIG. 12 is a cross-sectional view of an element showing one process of the FET manufacturing method of the seventh embodiment of a GaAs-based FET according to this invention.

Next, the source and the drain electrodes 78, 79 comprising ohmic contact metal are formed on the grown substrate surface by the lift-off process, etc., and the impurity doped InGaAs graded contact resistance reducing cap layer 76 is partially etched to be removed between the relevant source and the drain electrodes 78 and 79, and on this place, the metal Schottky junctioned to the relevant donor layer is formed as a gate electrode 77. When this cap layer 76 is etched, that is, the recess is etched, the etchant, for example, hydrochloric acid based etchant, which enables selective etching with a higher etching rate on InAs than on GaAs is used. As a result, the gate deposited surface, that is, InAlAs layer, can be processed flat as in the case of the ordinary recess surface, and at the same time, the recess edge can be formed into a curvilinear profile free of angles in one etching process because the In composition is varied in the graded manner. As a result, as shown in FIG. 11, because the concentration of the electric field is eliminated in the recess profile, improvement in high breakdown voltage can be achieved as shown in FIG. 5B without being restricted by the recess edge on the drain side.

Here, as one example, the case of the InAlAs/GaAs planar doped heterostructure FET is described, but this invention shall not be limited to this but can be applied to any FET which can use InGaAs for the cap layer. For the selective etchant, the hydrochloric acid based etchant is used, but the invention shall not be limited to this but can be applied to any etchant or gas which has a selectivity to InAs and GaAs.

(Fifth Embodiment)

In the first embodiment above, the In composition of the InGaAs of the impurity doped InGaAs contact resistance reducing cap layer is not increased in the graded manner but the InGaAs layer in which the In composition is higher by stages from the bottom portion to the surface side and is lowered in the vicinity of the top most surface can be used to obtain the similar potential distribution to that shown in FIG. 5 and the high breakdown voltage can be improved.

(Sixth Embodiment)

In the second embodiment above, the In composition of the InGaAs of the impurity doped InGaAs contact resistance reducing cap layer is not increased in the graded manner but the InGaAs layer in which the In composition is higher by stages from the bottom portion to the surface side and is lowered in the vicinity of the top most surface can be used to obtain the similar potential distribution to that shown in FIG. 7 and the high breakdown voltage can be improved.

As described above, according to this invention, the restriction of the high-breakdown voltage value due to the recess profile can be eliminated and high breakdown voltage can be achieved by using the InGaAs layer which varies the In composition in the graded manner or by stages for the contact resistance reducing cap layer of the recess type compound semiconductor FET as well as the InAs and GaAs selective etching in recess etching to make the recess profile a curvilinear profile and to prevent the concentration of the electric field from occurring at the recess edge, though there used to be a problem that the high breakdown voltage value was restricted by the avalanche yield caused by the concentration of electric field at the recess edge on the drain side due to the angular recess profile.

(Seventh Embodiment)

The seventh embodiment according to the present invention will be described hereinafter. FIGS. 12 through 15 are cross-sectional views showing a process for manufacturing the field effect transistor of the seventh embodiment according to this invention in order of processes. This embodiment is an embodiment of GaAs based MESFET, but this invention shall not be limited to FET of this material system or structure. With this embodiment, the recess profile is able to be formed in a curvilinear profile in one etching process, and high breakdown voltage can be achieved.

As shown in FIGS. 12 through 15, in FET of this embodiment, an impurity doped GaAs activated layer 112 and an impurity doped In implanted GaAs contact resistance reducing cap layer 113, for example, 100 nm thick are formed on the semi-insulating GaAs substrate 111 by epitaxial growth. The cap layer 113 has a recess structure etched in the form of arc with the center higher than the cap layer 113, and on the activated layer 112 exposed by this recess, a gate electrode 116 is formed, and on the cap layer 113, a source electrode 114 and a drain electrode 115 are formed.

The impurity doped In implanted GaAs contact resistance reducing cap layer 113 is formed as described below. In the process shown in FIG. 12, on the cap layer 113 as well as the drain electrode 115 and the source electrode 114, an ion implanting mask 210 such as resist, etc. is formed. This ion implanting mask 210 has an opening for ion implantation at a position slightly inclined to the drain electrode 115. For the surface of the cap layer 113 at the position matched to the opening not covered with this mask 210, the In ion is implanted with an energy of, for example, about 150 keV vertical to the cap layer 113 from the region right above (ion implantation 1).

Figure 13:
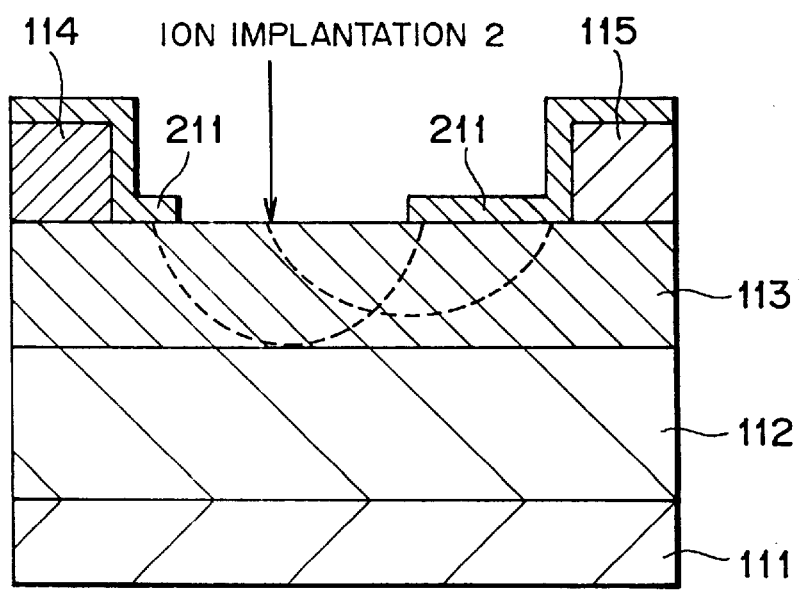
FIG. 13 is a cross-sectional view of an element showing one process of the FET manufacturing method of the seventh embodiment of a GaAs-based FET according to this invention.

Thereafter, as shown in FIG. 13, after removing the mask 210, a mask 211 with an opening at the position slightly inclined to the source electrode 114 is formed, and for the surface of the cap layer 113 at the position matched to the opening not covered with this mask 210, the In ion is implanted with an energy of, for example, about 280 keV vertical to the cap layer 113 from the region right above (ion implantation 2).

Figure 14:
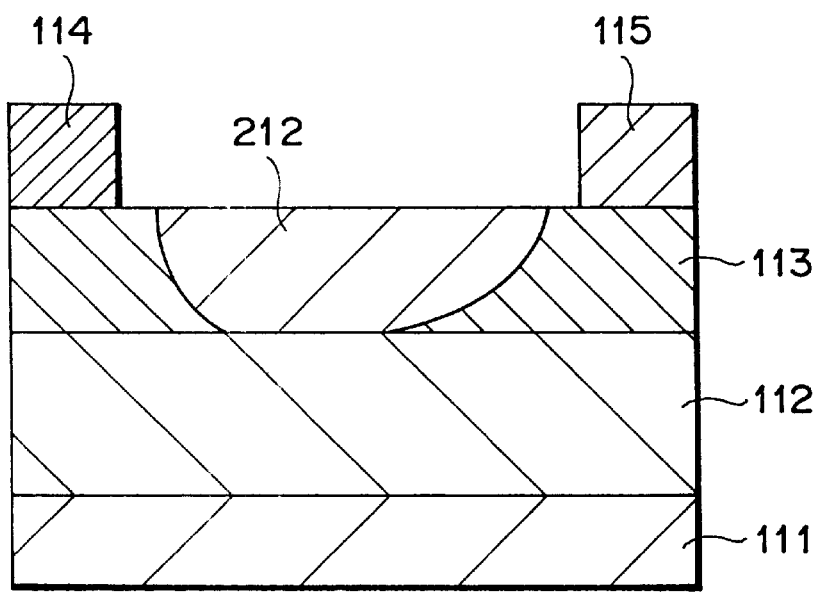
FIG. 14 is a cross-sectional view of an element showing one process of the FET manufacturing method of the seventh embodiment of a GaAs-based FET according to this invention.

By this, as shown in FIG. 14, an ion implantation region 212 is formed between the source electrode 114 and the drain electrode 115 of the cap layer 113.

Figure 15:
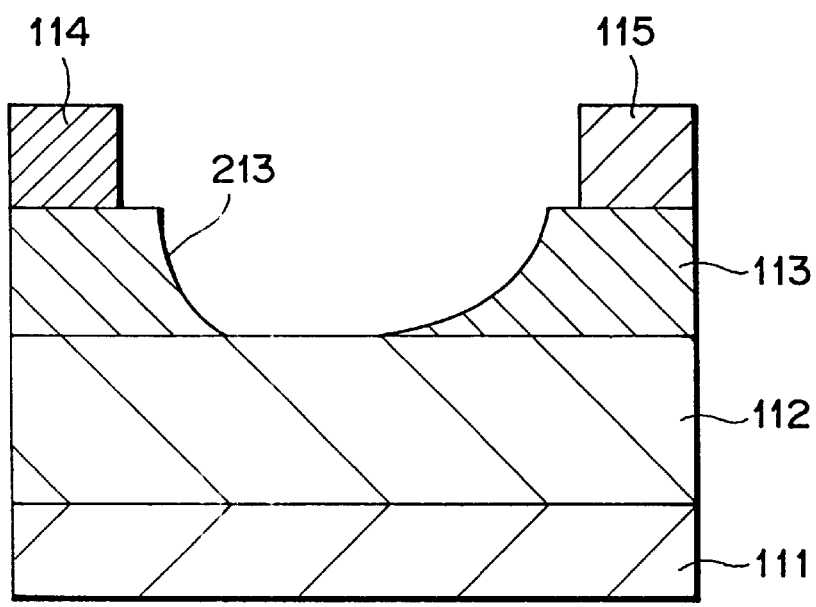
FIG. 15 is a cross-sectional view of an element showing one process of the FET manufacturing method of the seventh embodiment of a GaAs-based FET according to this invention.

And as shown in FIG. 15, the ion implantation region 212 only is removed by etching to form a recess profile 213. In the case of recess forming etching of this cap layer 113, etching is carried out by using, for example, a hydrochloric acid etchant which enables selective etching to provide a higher etching rate on InAs than on GaAs. As a result, a recess profile 213 as shown in FIG. 15 can be obtained by one etching process.

Figure 16:
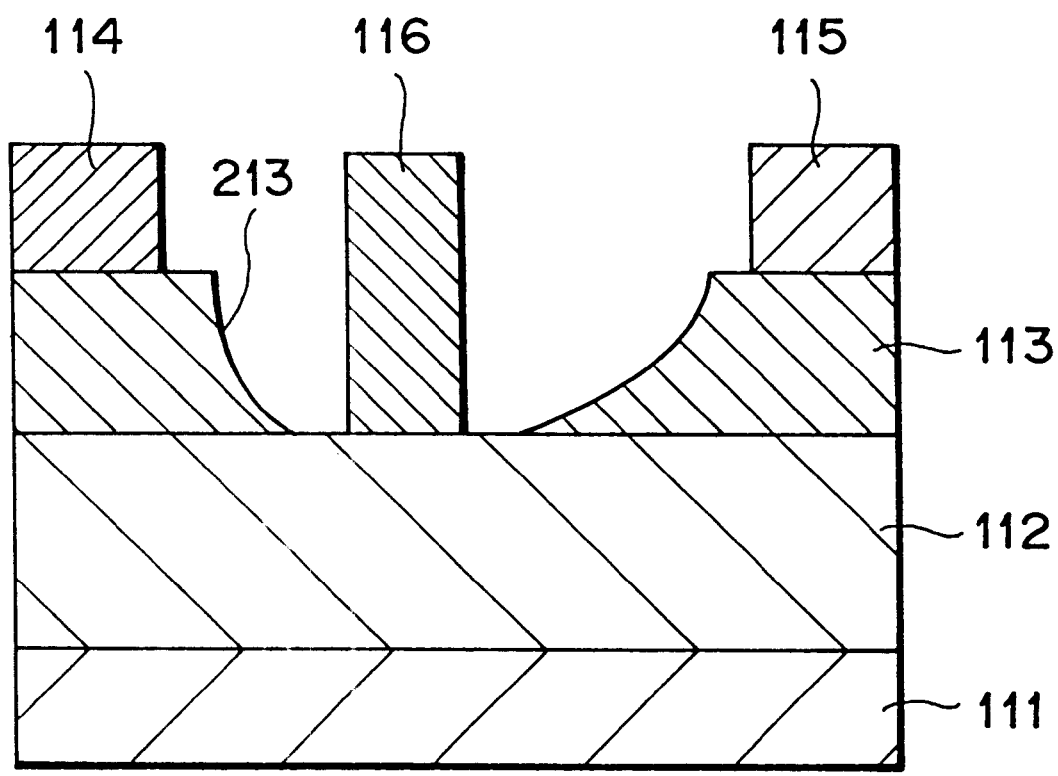
FIG. 16 is a cross-sectional view of an element owing one process of the FET manufacturing method of the seventh embodiment of a GaAs-based FET according to this invention.

Lastly, as shown in FIG. 16, a gate electrode 116 comprising the metal Schottky junctioned to the donor layer is formed on the portion of the recess profile 213 removed by etching using the lift-off process, etc.

Figure 17:
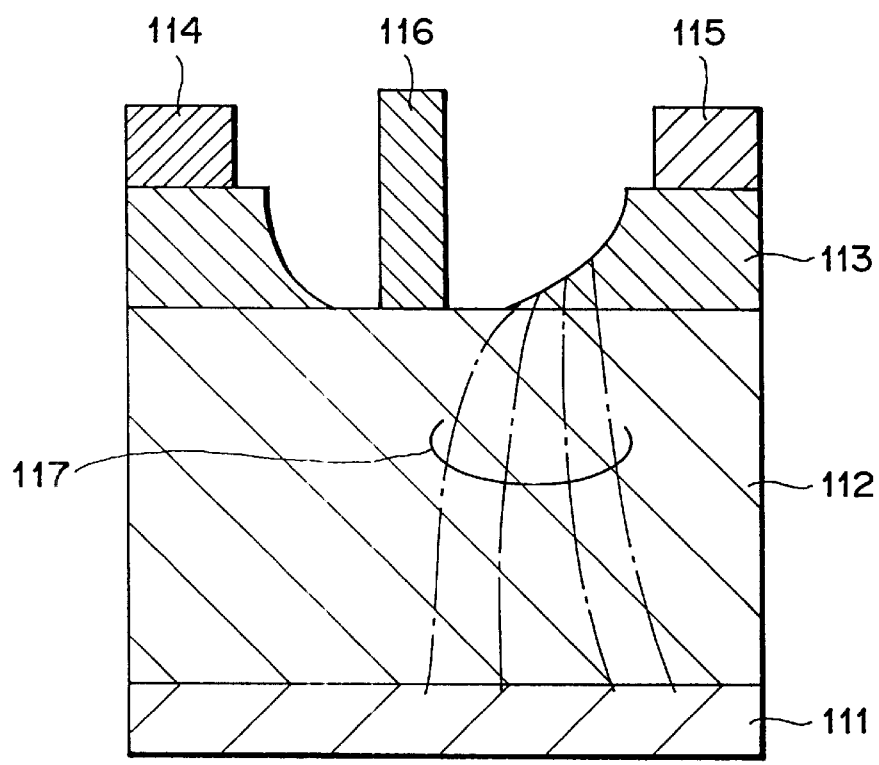
FIG. 17 is a potential distribution diagram when FET of the seventh embodiment of FIG. 12 is operated.
Figure 18:
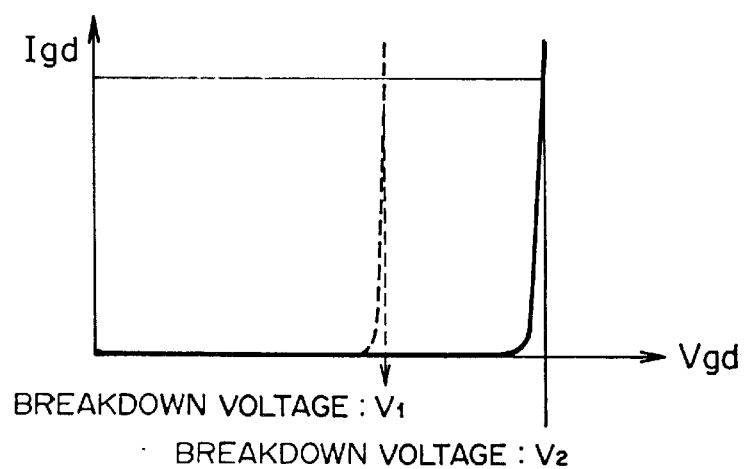
FIG. 18 is a gate-drain breakdown characteristics of the same.

As a result, as shown in FIG. 17, because the potential distribution 117 is free of the electric field concentrated portion in the recess profile 213 and is not restricted by the recess edge on the drain side. Consequently, this embodiment has the breakdown voltage improved. The solid line of FIG. 18 shows the breakdown voltage characteristics of this embodiment, while the broken line shows the breakdown voltage characteristics of the conventional transistor. As shown in FIG. 18, the breakdown voltage value V2 of the embodiment is higher than the breakdown voltage value V1 of the conventional transistor, and the breakdown voltage characteristics are improved.

This embodiment describes the case of a GaAs MESFET but this invention is not limited to this, but this invention can be applicable if GaAs can be used for the cap layer, such as GaAs based heterostructure FET, etc. In addition, the thickness of GaAs layer, In ion implantation condition and profile can be optionally selected. In this embodiment, for the selective etchant, the hydrochloric acid based etchant is used, but the invention shall not be limited to this but can be applied to any etchant or gas which has a selectivity to InAs and GaAs.

(Eighth Embodiment)

FIGS. 19 through 22 are cross-sectional views showing a process for manufacturing a field effect transistor of the eighth embodiment according to this invention. This embodiment has this invention applied to the GaAs based heterostructure FET, but this invention is not limited to FET of this material system or construction. In this embodiment, the recess profile is able to be formed in a curvilinear profile in one etching process and high breakdown voltage can be achieved.

Figure 19:
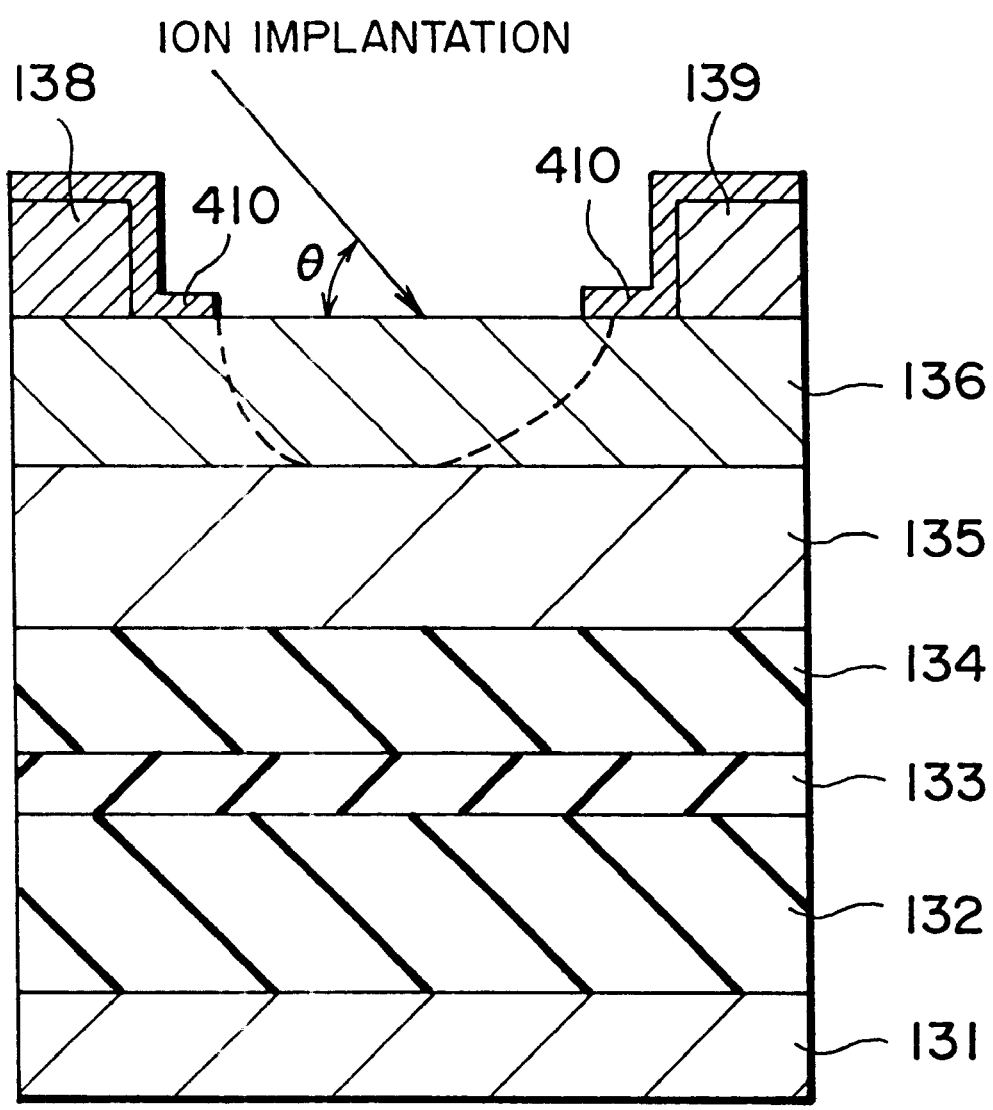
FIG. 19 is a cross-sectional view of an element showing one process of the FET manufacturing method of the eighth embodiment of a GaAs-based FET according to this invention.

As shown in FIG. 19, on the semi-insulating GaAs substrate 131, the undoped GaAs buffer layer 132, undoped $Al_{0.3}Ga_{0.7}As$ heterostructure buffer layer 133, undoped GaAs channel layer 134, impurity doped $Al_{0.3}Ga_{0.7}As$ donor layer 135 and impurity doped GaAs contact resistance reducing cap layer 136 are formed by the epitaxial growth. The thickness of this cap layer 136 is, for example, 100 nm. On the cap layer 136, source electrode 138, and drain electrode 139, resist mask 410 with an opening at the portion where etching is planned to be carried out right below the gate of the cap layer 136 is formed. And the In ion is implanted at the energy of, for example, about 300 keV to the surface of the cap layer 136 via the mask 410, in the direction inclined at an angle of θ to the surface of the cap layer 36 from the position slightly inclined upwards of the source electrode 138 to the position slightly inclined to the drain electrode 139.

Figure 20:
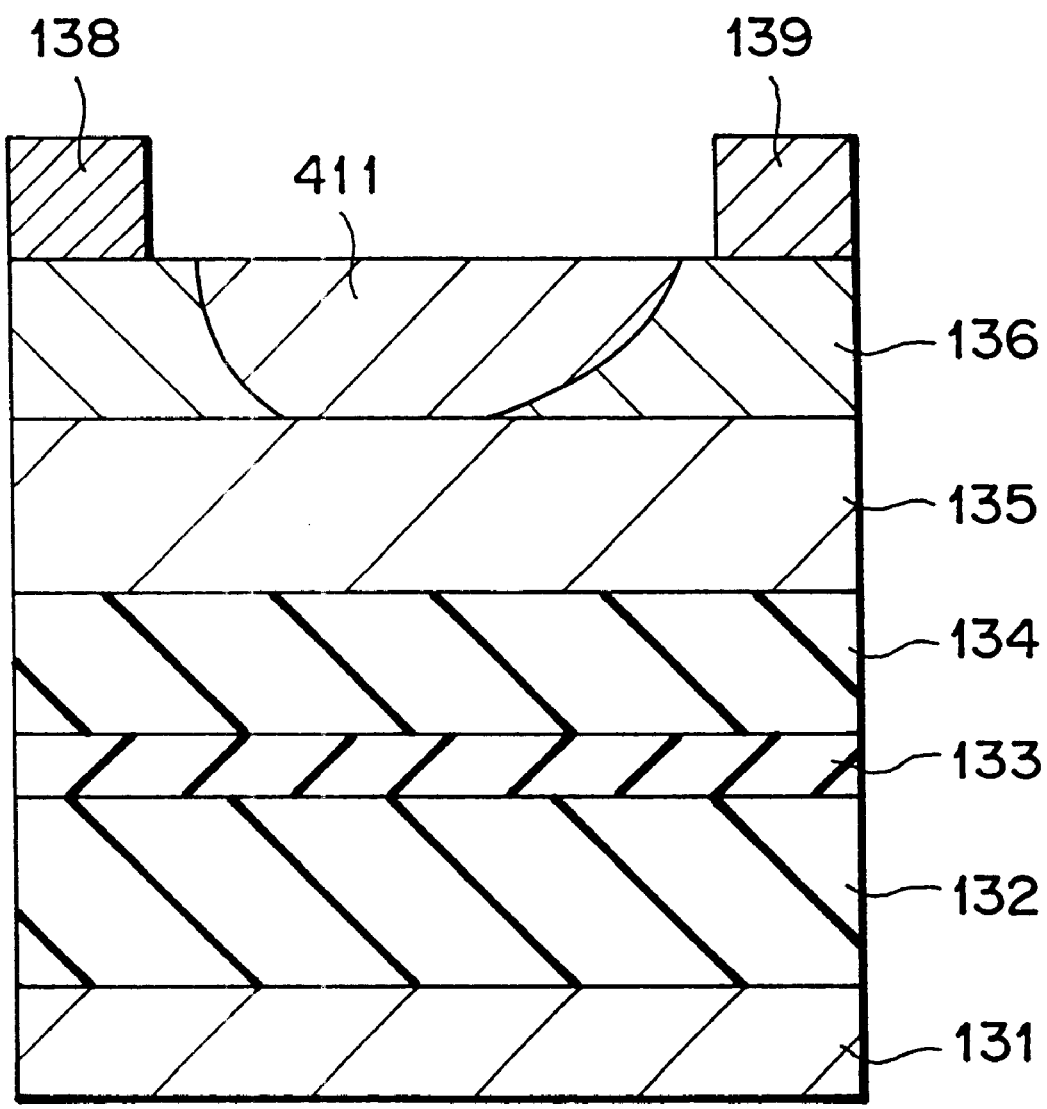
FIG. 20 is a cross-sectional view of an element showing one process of the FET manufacturing method of the eighth embodiment of a GaAs-based FET according to this invention.

As a result, as shown in FIG. 20, the In injected profile 411 is obtained in the cap layer 136.

Figure 21:
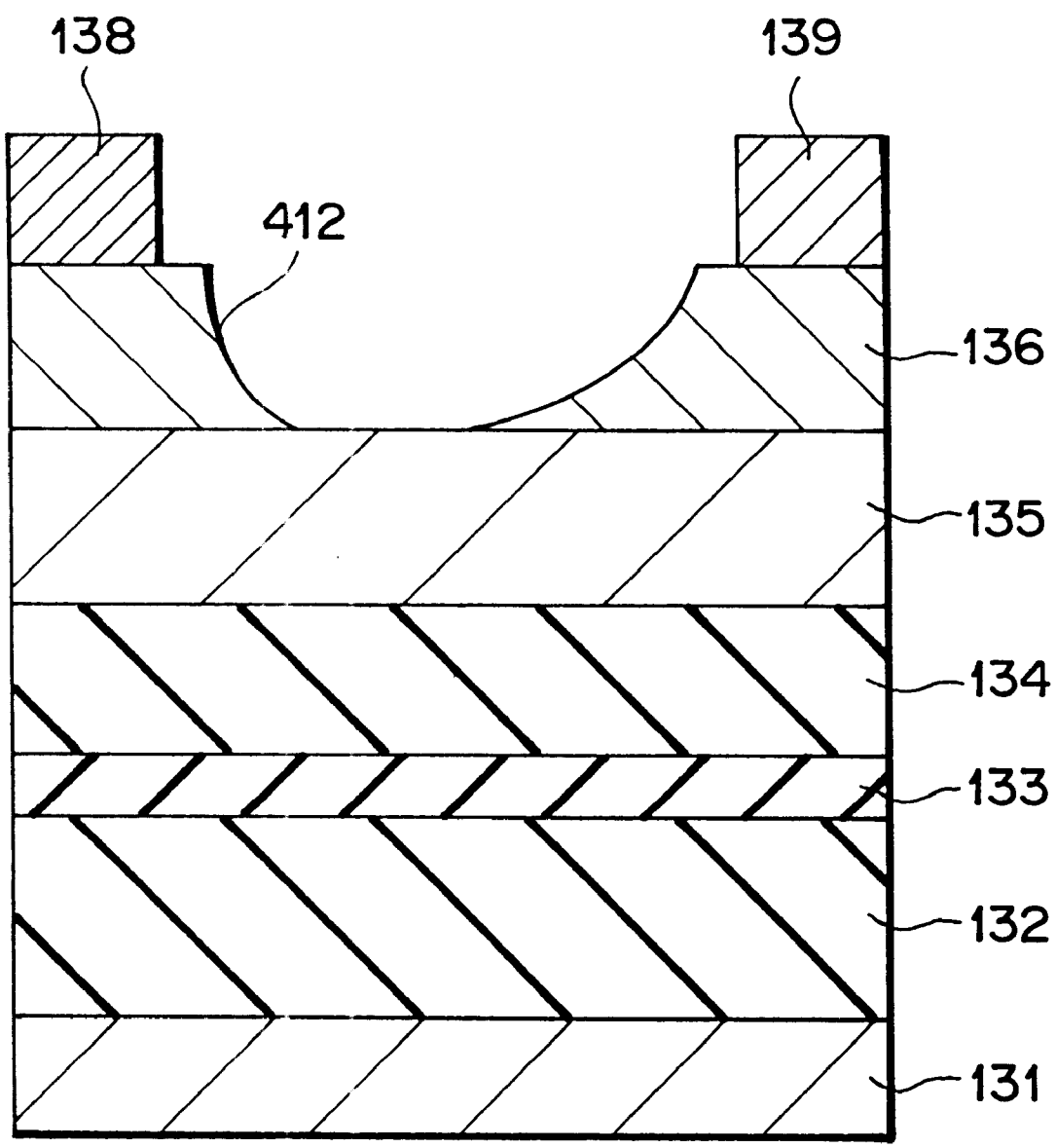
FIG. 21 is a cross-sectional view of an element showing one process of the FET manufacturing method of the eighth embodiment of a GaAs-based FET according to this invention.

Then, as shown in FIG. 21, the cap layer 36 is etched to form a recess profile 412. In this recess-etching, for example, the hydrochloric based etchant is used so that selective etching with an etching rate higher on InAs than on GaAs can be carried out. As a result, by one etching process, the etching profile as that of the recess profile 412 shown in FIG. 21 can be obtained.

Figure 22:
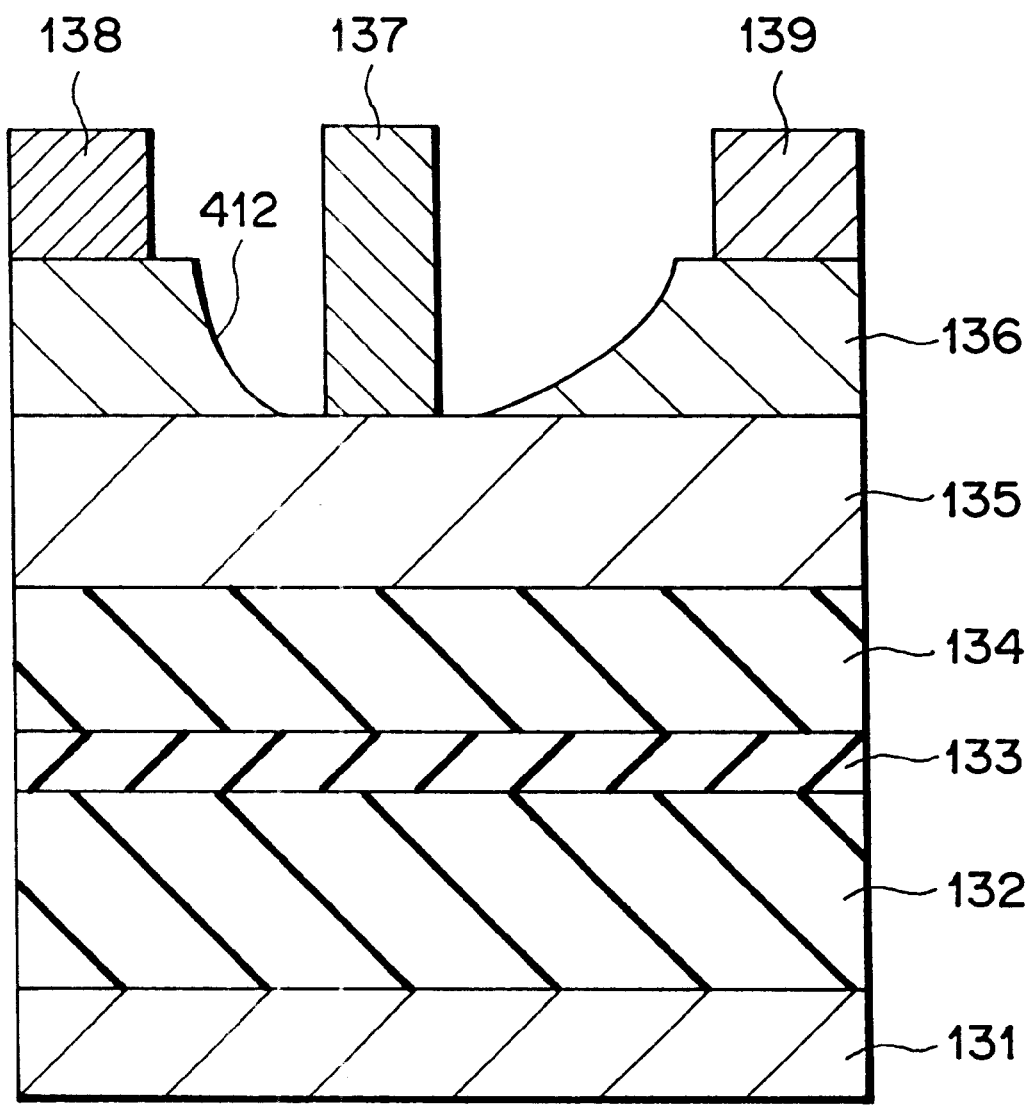
FIG. 22 is a cross-sectional view of an element showing one process of the FET manufacturing method of the eighth embodiment of a GaAs-based FET according to this invention.

Lastly, as shown in FIG. 22, the metal Schottky Functioned to the donor layer 135 is formed as a gate electrode 137 on the portion removed by etching using the lift-off method, etc.

As a result, as shown in FIG. 17, because the potential distribution is free of the electric field concentrated portion in the recess profile 412 and is not restricted by the recess edge on the drain side. Consequently, as shown in FIG. 18, this embodiment has the breakdown voltage improved.

This embodiment describes the case of AlGaAs/GaAs heterostructure FET, as an example, but this invention shall not be limited to this but can be applicable to FET which can use GaAs as a cap layer such as GaAs MESFET, etc. In addition, the thickness of GaAs layer, In ion implantation condition and profile can be optionally selected. In this embodiment, for the selective etchant, the hydrochloric acid based etchant is used, but the invention shall not be limited to this but can be applied to any etchant or gas which has a selectivity to InAs and GaAs.

(Ninth Embodiment)

FIGS. 23 through 27 are cross-sectional views showing a process for manufacturing a field effect transistor of the ninth embodiment according to this invention. This embodiment has this invention applied to the GaAs based heterostructure FET's as an example, but this invention is not limited to FED of this material system or construction. In this embodiment, the recess profile is able to be formed in a curvilinear profile in one etching process and high breakdown voltage can be achieved.

As shown in FIG. 23 through 27, on the semi-insulating GaAs substrate 141, the undoped GaAs buffer layer 142, undoped $Al_{0.3}Ga_{0.7}As$ As heterostructure buffer layer 143, undoped GaAs channel layer 144, impurity doped $Al_{0.3}Ga_{0.7}As$ donor layer 145 and impurity doped GaAs contact resistance reducing cap layer 146 are formed by the epitaxial growth. The thickness of this cap layer 146 is, for example, 100 nm.

Figure 23:
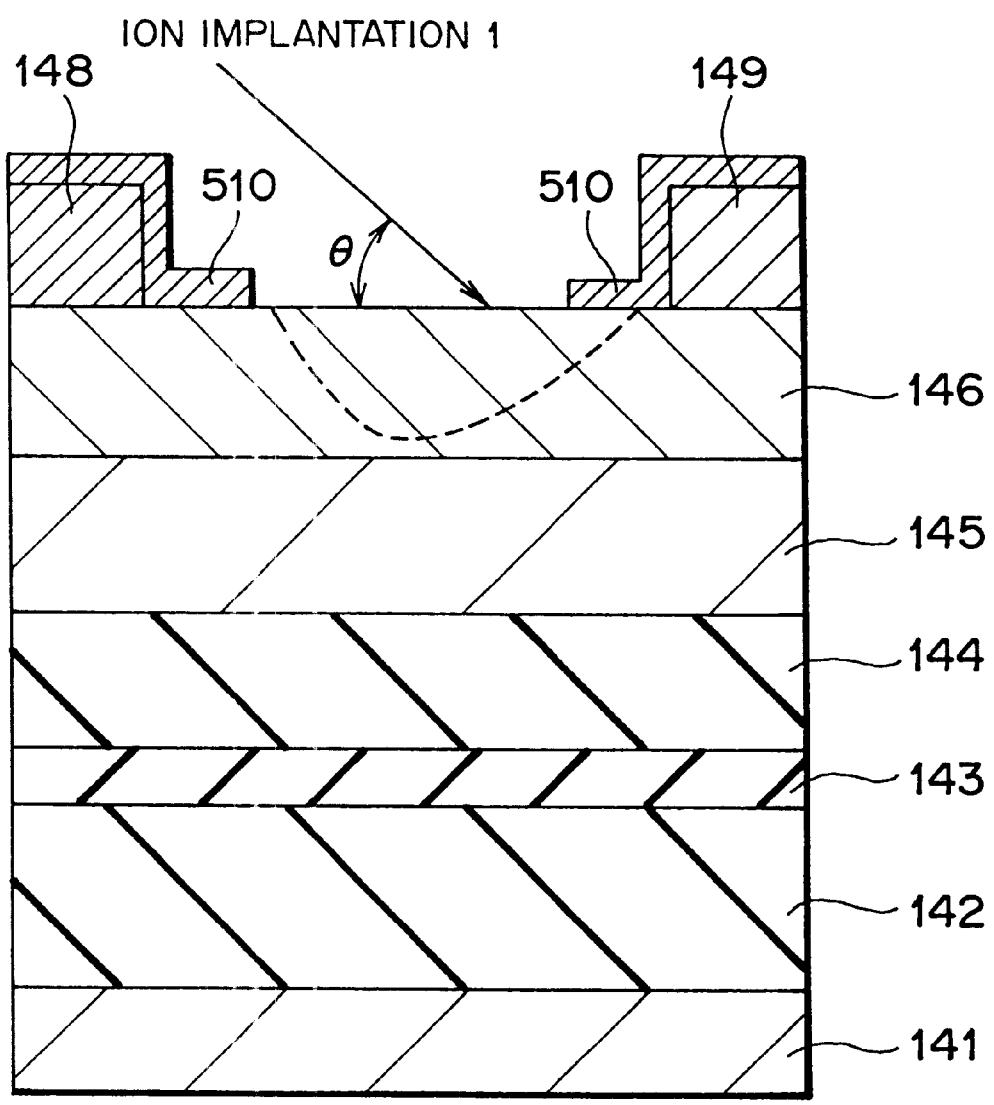
FIG. 23 is a cross-sectional view of an element showing one process of the FED manufacturing method of the ninth embodiment of a GaAs-based FET according to this invention.

Now, in the impurity doped In ion implanting GaAs contact resistance reduction cap layer 146, the portion where etching is planned to be carried out right below the gate is In ion implanted at, for example, about 150 keV obliquely at an acute angle θ with respect to the source drain surface from the source side for the opening of the mask 510 with resist, etc. as shown in FIG. 23.

Figure 24:
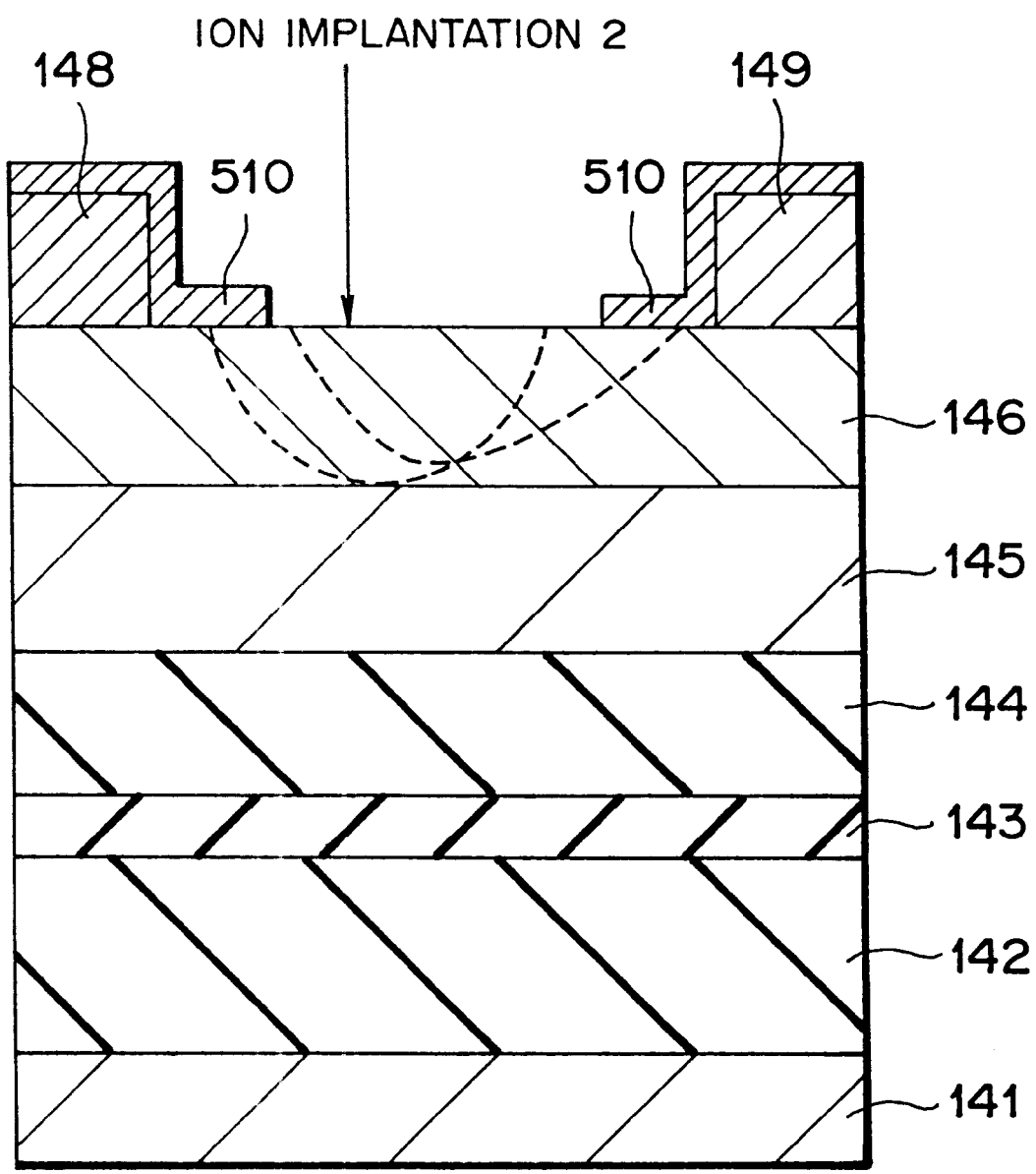
FIG. 24 is a cross-sectional view of an element showing one process of the FET manufacturing method of the ninth embodiment of a GaAs-based FET according to this invention.
Figure 25:
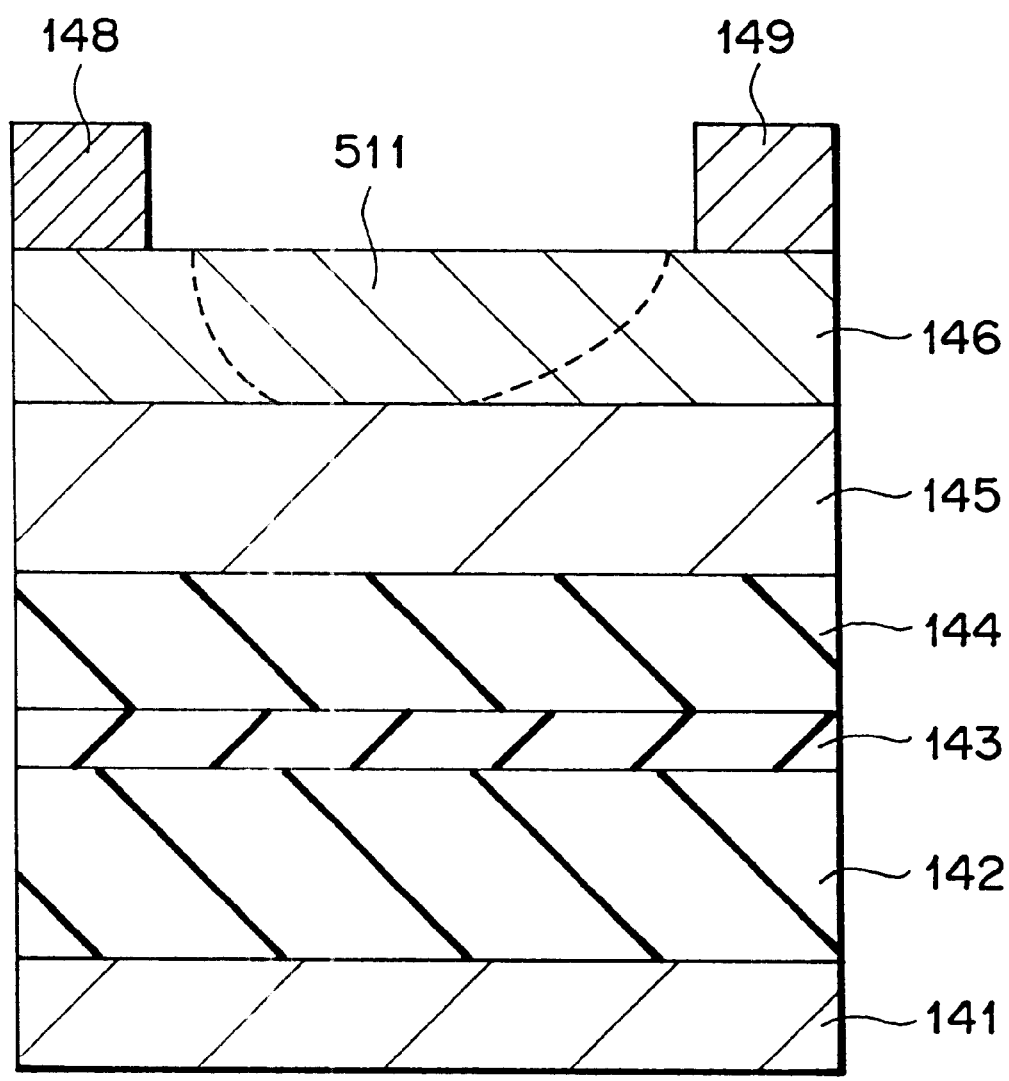
FIG. 25 is a cross-sectional view of an element showing one process of the FET manufacturing method of the ninth embodiment of a GaAs-based FET according to this invention.
Figure 26:
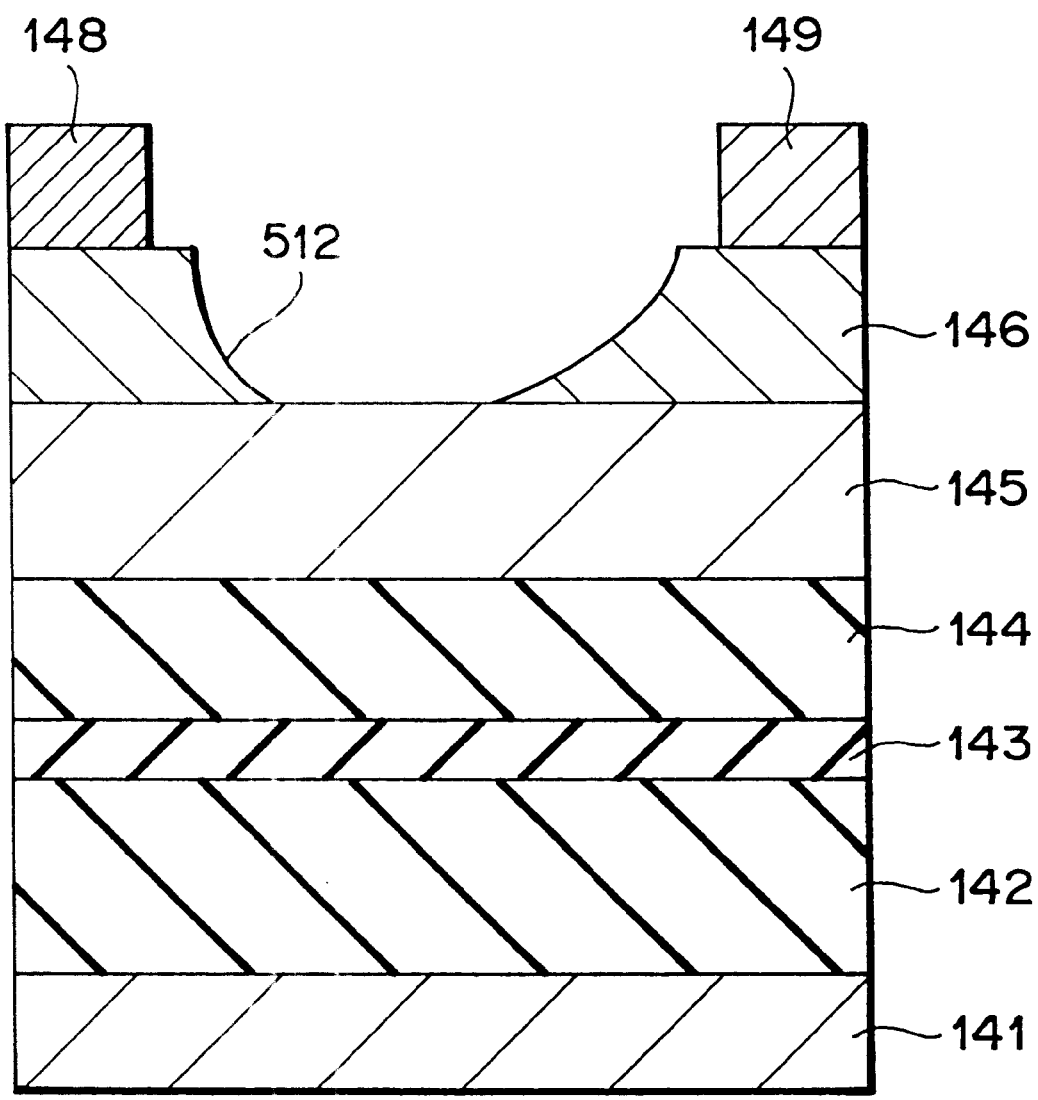
FIG. 26 is a cross-sectional view of an element showing one process of the FET manufacturing method of the ninth embodiment of a GaAs-based FET according to this invention.

Then, as shown in FIG. 24, for the portion not masked (opening of the mask 510) with resist, etc., In ions are implanted at, for example, about 280 keV from right above. As a result of going through the processes of FIGS. 23 and 24, an In implantation profile 511 as shown in FIG. 25 is formed on the cap layer 146. In this recess-etching, for example, the hydrochloric based etchant is used so that selective etching with an etching rate higher on InAs than on GaAs can be carried out. As a result, by one etching process, the etching profile as that of the recess profile 512 as shown in FIG. 25 can be obtained.

Figure 27:
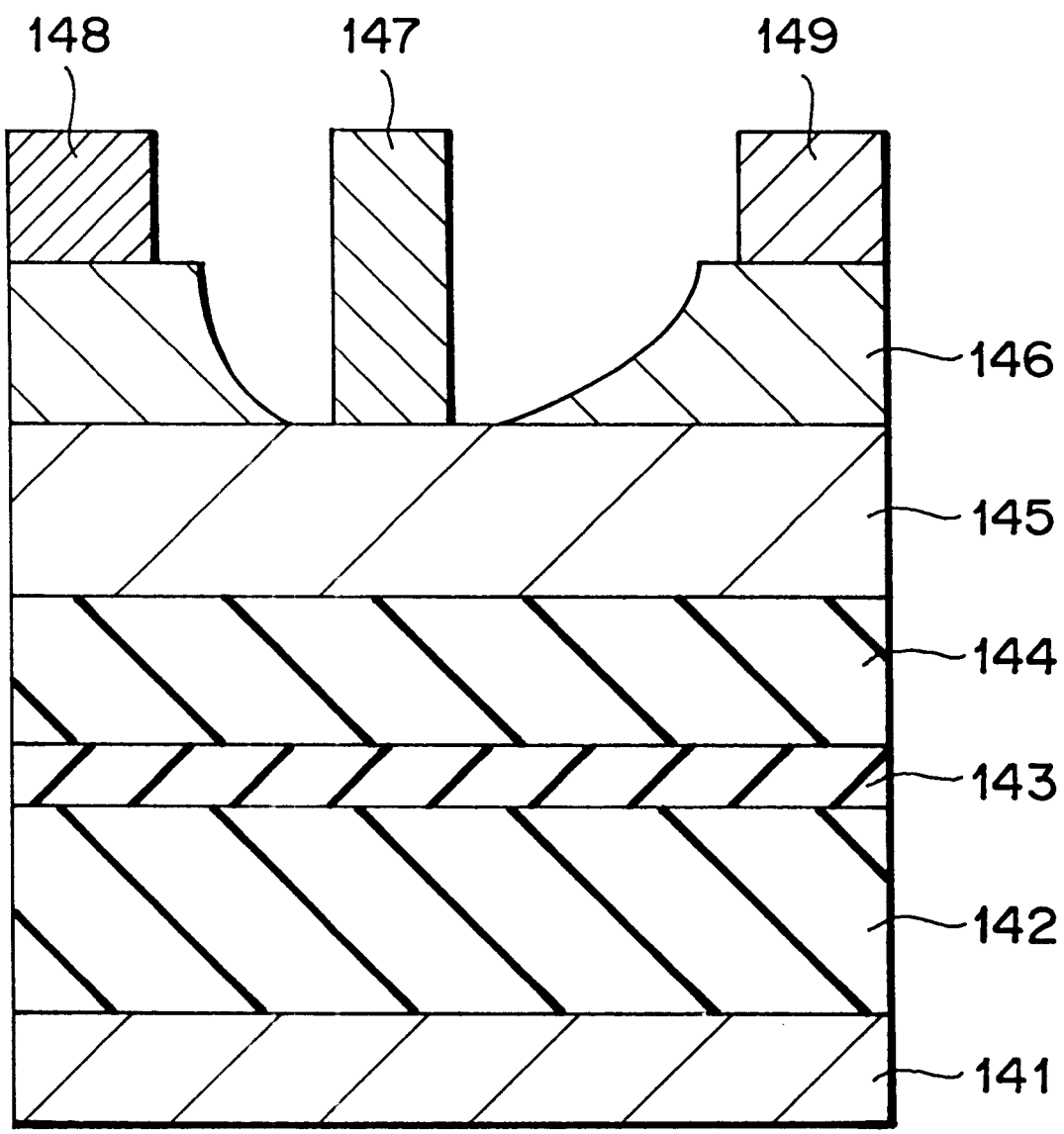
FIG. 27 is a cross-sectional view of an element showing one process of the FET manufacturing method of the ninth embodiment of a GaAs-based FET according to this invention.

Lastly, as shown in FIG. 27, the metal Schottky junctioned to the donor layer 145 is formed as a gate electrode 147 on the portion removed by etching using the lift-off method, etc.

As a result, as shown in FIG. 17, because the electric field concentrated portion is eliminated in the recess profile, the improvement in breakdown voltage can be achieved as shown in FIG. 18 without restricting by the recess edge on the drain side.

This embodiment describes the case of AlGaAs/GaAs heterostructure FET, as an example, but this invention shall not be limited to this but can be applicable to FET which can use GaAs as a cap layer such as GaAs MESFET, etc. In addition, the thickness of GaAs layer, In ion implantation condition and profile can be optionally selected. In this embodiment, for the selective etchant, the hydrochloric acid based etchant is used, but the invention shall not be limited to this but can be applied to any etchant or gas which has a selectivity to InAs and GaAs.

Figure 28:
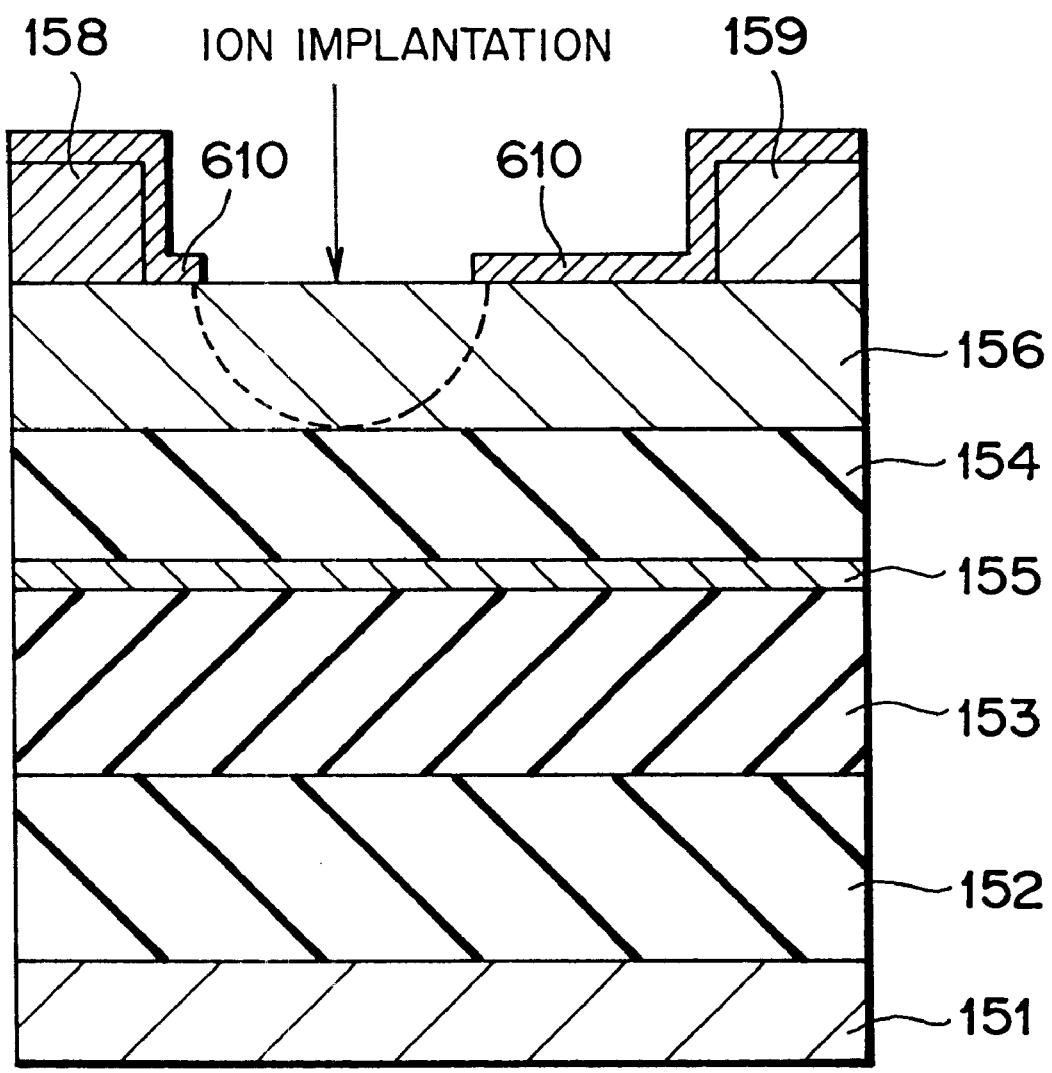
FIG. 28 is a cross-sectional view of an element showing one process of the FET manufacturing method of the tenth embodiment of a GaAs-based FET according to this invention.
Figure 29:
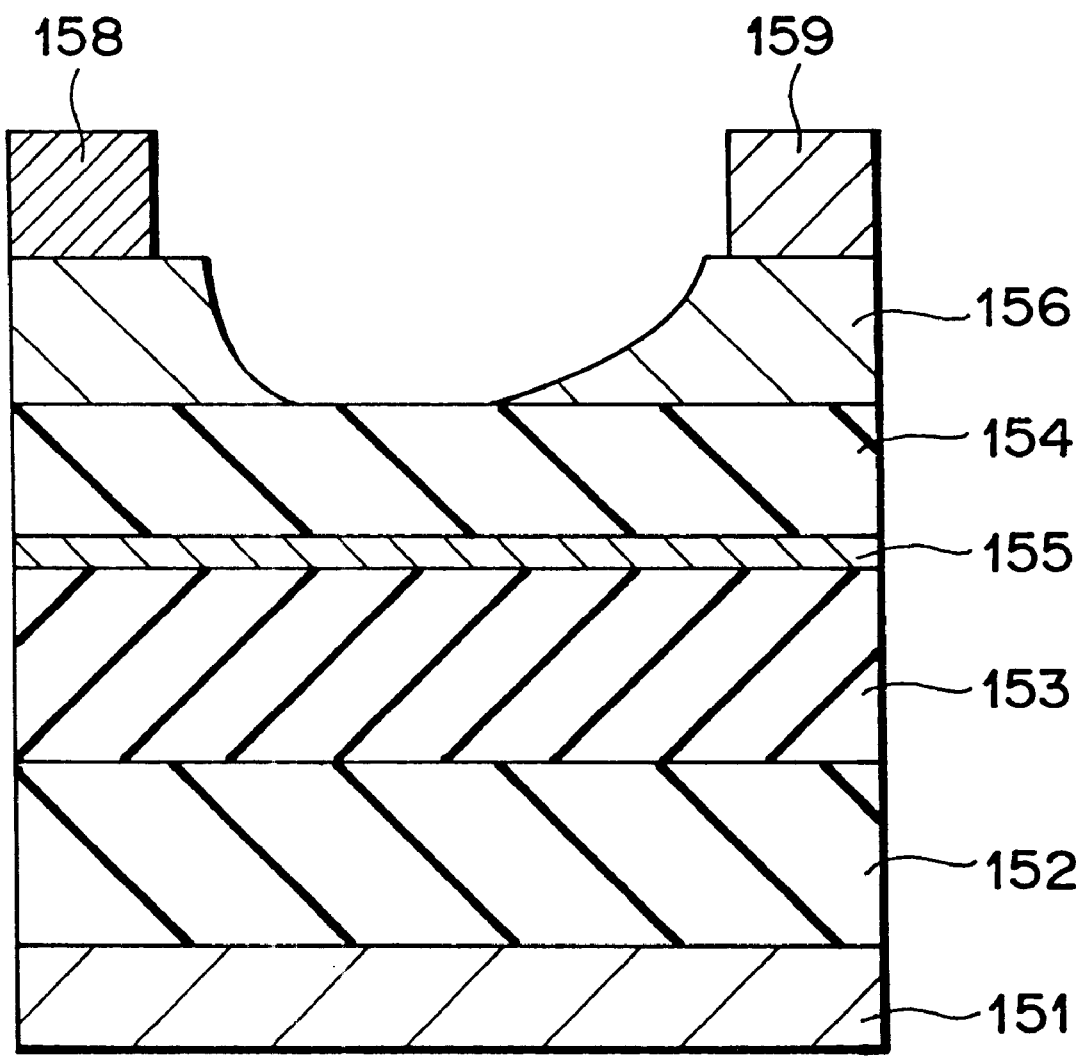
FIG. 29 is a cross-sectional view of an element showing one process of the FET manufacturing method of the tenth embodiment of a GaAs-based FET according to this invention.
Figure 30:
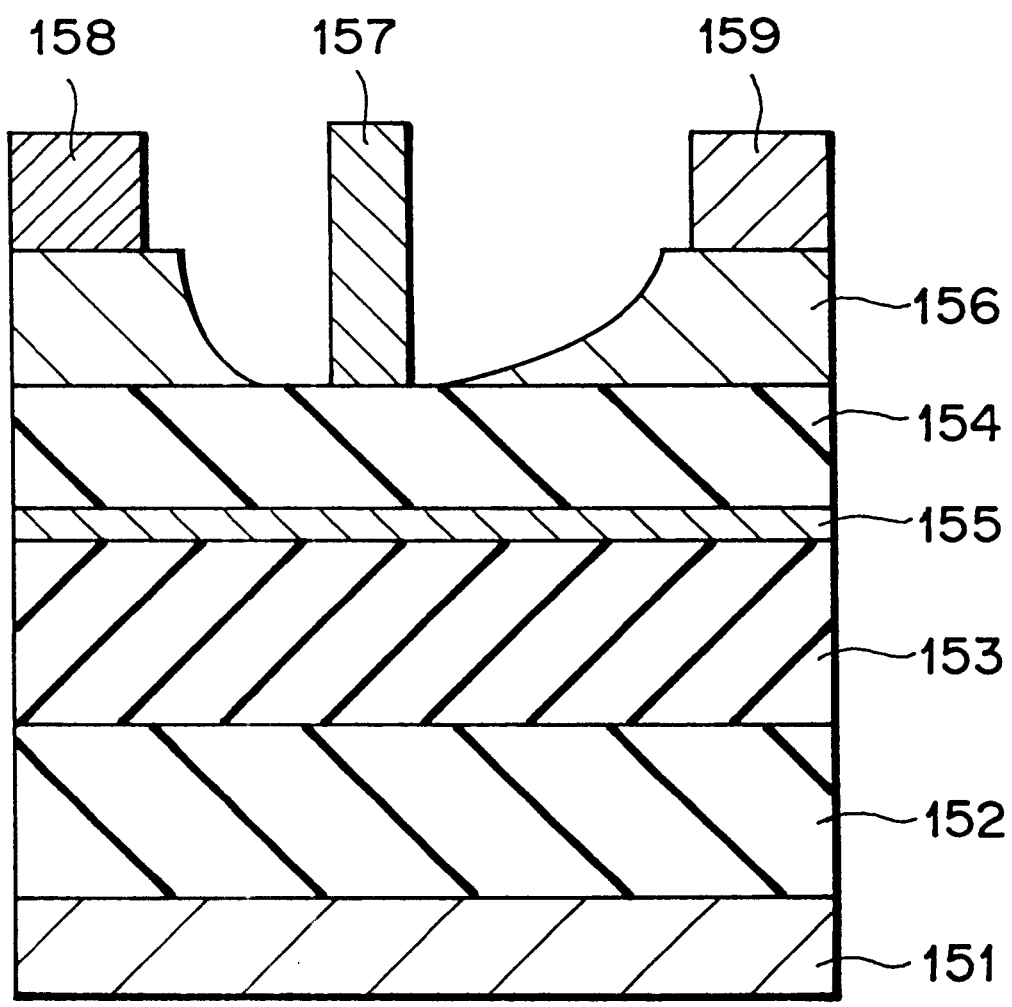
FIG. 30 is a cross-sectional view of an element showing one process of the FET manufacturing method of the tenth embodiment of a GaAs-based FET according to this invention.

Referring now to FIGS. 28 through 30, the tenth embodiment of this invention will be described. In this case, an embodiment for the InP based heterostructure FET will be described as an example, but this invention is not limited to FET of this material system or construction. In this embodiment, the recess profile is able to be formed in a curvilinear profile in one etching process and high breakdown voltage can be achieved. In this embodiment, on the semi-insulating InP substrate 151, the undoped $In_{0.48}Al_{0.52}As$ buffer layer 152, undoped $In_{0.53}Ga_{0.47}As$ channel layer 153, undoped $In_{0.48}Al_{0.52}As$ donor layer 154, Si planar dope 155 and 50-nm-thick impurity doped In ion implanting $In_{0.53}Ga_{0.47}As$ contact resistance reducing cap layer 156 are formed by the epitaxial growth. In the impurity doped In ion implanting GaAs contact resistance reduction cap layer 156, the portion where etching is planned to be carried out right below the gate is first In ion implanted at, for example, about 150 keV obliquely with respect to the source drain surface from the source side for the opening of the mask 610 with resist, etc. as shown in FIG. 28.

As a result, because of the contact resistance reducing cap layer 156, the on-implanted portion only has increased the In concentration, the In concentration on the source side becomes higher than on the drain side. In this recess-etching, for example, the hydrochloric based etchant is used so that selective etching with an etching rate higher on InAs than on GaAs can be carried out. As a result, by one etching process, the etching profile as that of the recess profile 512 as shown in FIG. 29 can be obtained.

Lastly, as shown in FIG. 30, the metal Schottky junctioned to the donor layer 154 is formed as a gate electrode 157 on the portion removed by etching using the lift-off method, etc. As a result, as shown in FIG. 17, because the electric field concentrated portion is eliminated in the recess profile, the improvement in breakdown voltage can be achieved as shown in FIG. 18 without restricting by the recess edge on the drain side.

In this case, there described is the case of InAlAs/InGaAs heterostructure FET, as an example, but this invention shall not be limited to this but can be applicable to FET which can use $In_xGa_{1-x}As$ ($x \leq 0.53$) as a cap layer such as InP MESFET, etc. In addition, the thickness of $In_xGa_{1-x}As$ ($x \leq 0.53$) layer, In ion implantation condition and profile can be optionally selected. In this embodiment, for the selective etchant, the hydrochloric acid based etchant is used, but the invention shall not be limited to this but can be applied to any etchant or gas which has a selectivity to InAs and GaAs.

(Eleventh Embodiment)

Figure 31:
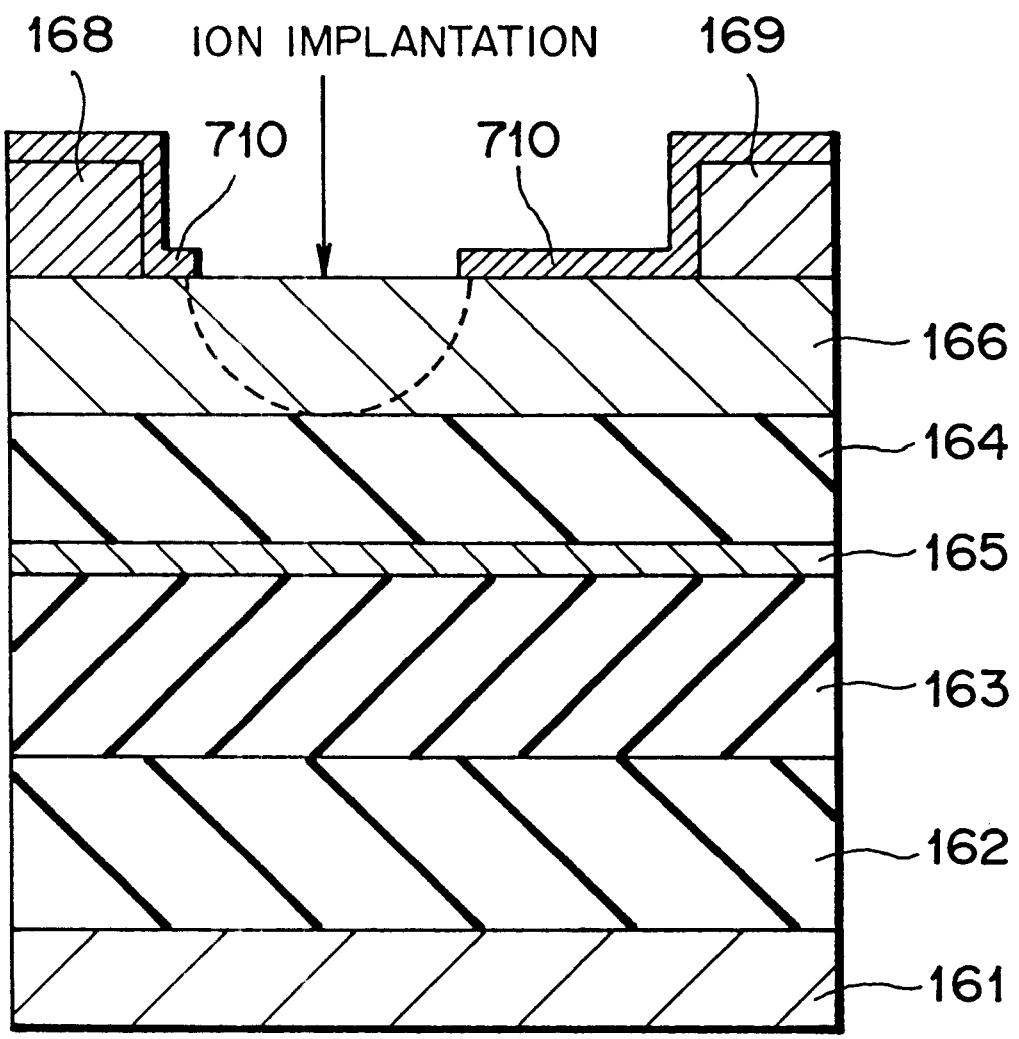
FIG. 31 is a cross-sectional view of an element showing one process of the FET manufacturing method of the seventh embodiment of a GaAs-based FET according to this invention.
Figure 32:
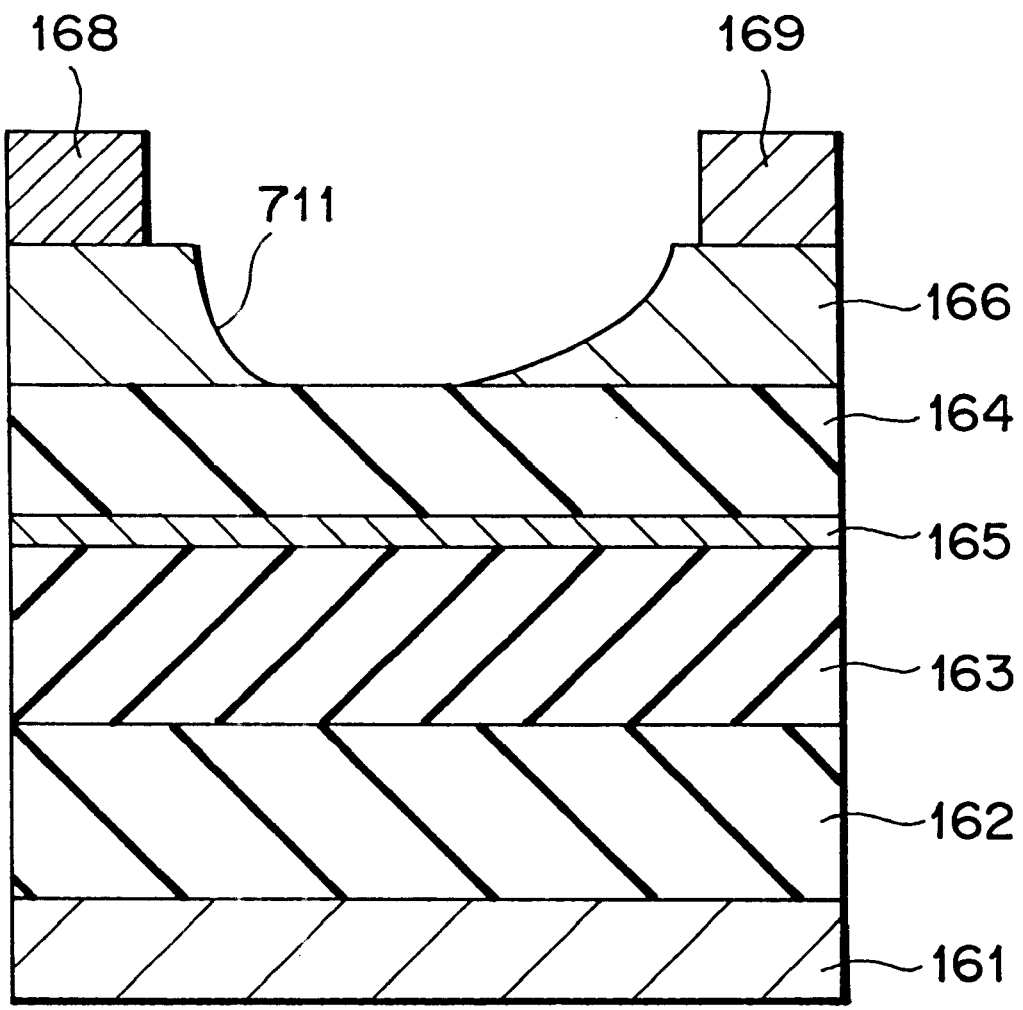
FIG. 32 is a cross-sectional view of an element showing one process of the FET manufacturing method of the eleventh embodiment of a GaAs-based FET according to this invention.
Figure 33:
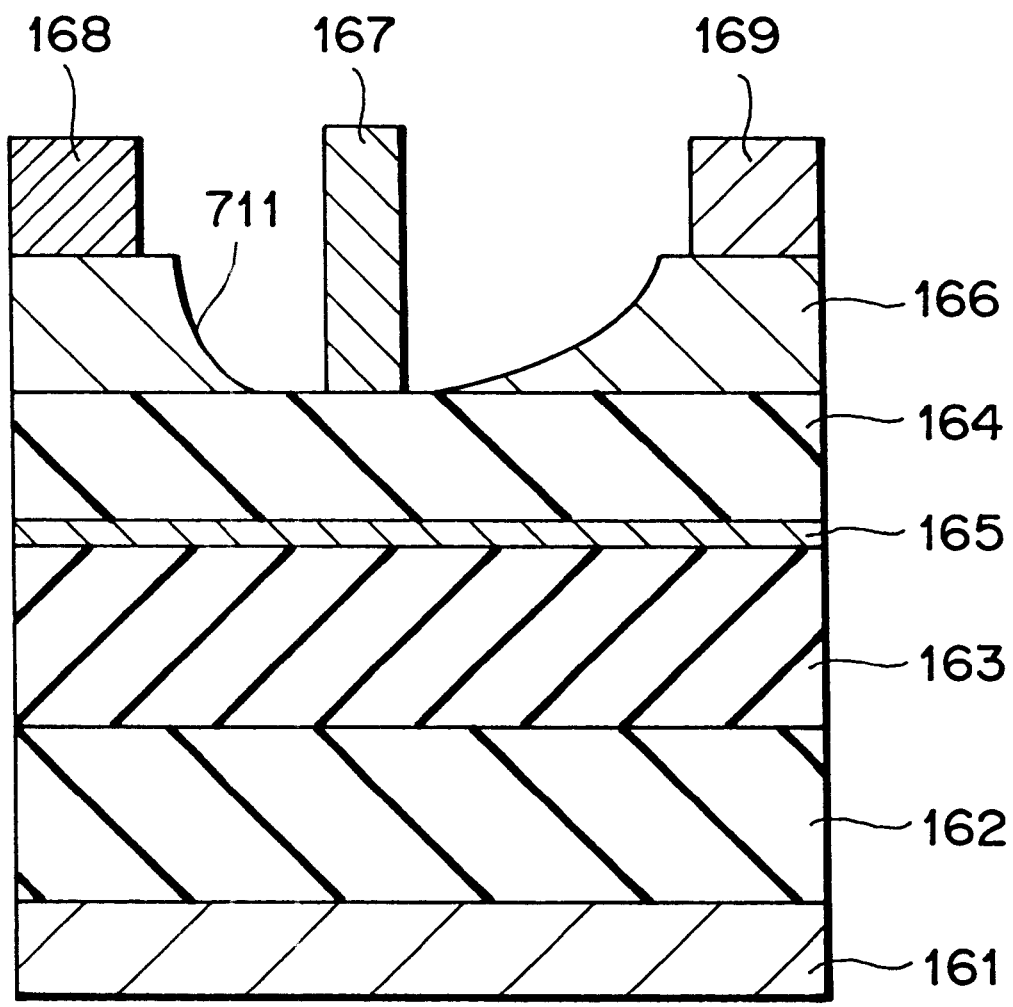
FIG. 33 is a cross-sectional view of an element showing one process of the FET manufacturing method of the eleventh embodiment of a GaAs-based FET according to this invention.

Referring now to FIG. 31 through 33, the eleventh embodiment of this invention will be described. In this case, an embodiment for the InP based heterostructure FET will be described as an example, but this invention is not limited to FET of this material system or construction. In this embodiment, the recess profile is able to be formed in a curvilinear profile in one etching process and high breakdown voltage can be achieved. On the semi-insulating InP substrate 161, the undoped $In_{0.48}Al_{0.52}As$ buffer layer 162, undoped $In_{0.53}Ga_{0.47}As$ channel layer 163, undoped $In_{0.48}Al_{0.52}As$ donor layer 164, Si planar dope 165 and impurity doped In ion implanting InGaAs graded contact resistance reducing cap layer 166 are formed by the epitaxial growth. The thickness of the cap layer 166 is, for example, about 50 nm.

The impurity doped InGaAs graded contact resistance reducing cap layer 166 has the In composition increased from the substrate side to the surface side. In the impurity doped In ion implanting InGaAs graded contact resistance reduction cap layer 166, the portion where etching is planned to be carried out right below the gate is first In ion implanted at, for example, about 150 keV for the portion slightly closer to the source side not covered with mask 710 such as resist, etc. shown in FIG. 31. As a result, the In concentration on the ion-implanted source side becomes higher than on the drain side. In the recess-etching of this cap layer 166, for example, the hydrochloric based etchant is used so that selective etching with an etching rate higher on InAs than on GaAs can be carried out. As a result, by one etching process, the etching profile as that of the recess profile 711 as shown in FIG. 32 can be obtained.

Lastly, as shown in FIG. 33, the metal Schottky junctioned to the donor layer 164 is formed as a gate electrode 167 on the portion removed by etching using the lift-off method, etc. As a result, though the material system differs, because the electric field concentrated portion is eliminated in the recess profile 711 as shown in FIG. 17, the improvement in breakdown voltage can be achieved as shown in FIG. 18 without restricting by the recess edge on the drain side.

In this case, there described is the case of InAlAs/InGaAs heterostructure FET, as an example, but this invention shall not be limited to this but can be applicable to this if it is an FET which can use InGaAs graded layer as a cap layer such as an InP MESFET, etc. In addition, the thickness of InGaAs layer, In ion implantation condition and profile can be optionally selected. In this embodiment, for the selective etchant, the hydrochloric acid based etchant is used, but the invention shall not be limited to this but can be applied to any etchant or gas which has a selectivity to InAs and GaAs.

As described, above, though the conventional transistor had a problem of restricting the breakdown voltage value by avalanche yield due to the electric field concentration at the recess edge on the drain side because it has an angular recess profile, but according to this invention, by ion-implanting In once or more than once from right above or obliquely to the recess-etched removed portion of $In_xGa_{1-x}As$ ($x \leq 0.53$) including GaAs as a contact resistance reducing cap layer of the recess type compound semiconductor FET and in addition by using selective etching to InAs and GaAs at the time of recess etching, the recess profile on the drain side can be formed in a more gentle curvilinear profile than on the source side in one recess etching process. As a result, by preventing the occurrence of electric field concentration at the recess edge, restriction to breakdown voltage value by the recess profile can be eliminated, and therefore, high breakdown voltage can be achieved. At the same time, on the source side, the profile is not so much hollowed out than that on the drain side, it is possible to suppress degradation of the source resistance and to maintain the FET characteristics.

What is claimed is:

1. A field effect transistor, comprising:
   a compound semiconductor substrate;
   a channel layer and donor layer laminated above the compound semiconductor substrate;
   a contact resistance reducing cap layer laminated on the donor layer;
   a source electrode and a drain electrode formed on respective portions of said contact resistance reducing cap layer; and
   a gate electrode formed on the donor layer, wherein the cap layer portion between the source and drain electrodes is partially exposed and removed by selective etching, to form a recess structure, the recess structure having a recess edge which has a profile that prevents a concentration of electric field, wherein the recess edge is curvilinear.

2. A field effect transistor according to claim 1 wherein the contact resistance reducing cap layer is formed with a material having a graded composition which is easily etched from a bottom portion towards a surface side.

3. A field effect transistor according to claim 2 wherein said material is an InGaAs graded layer in which the In composition is increased from the bottom portion towards the surface side.

4. A field effect transistor according to claim 2 wherein the material is an InGaAs graded layer in which the In composition is increased from the bottom portion towards the surface side and wherein the In composition is reduced again in the vicinity of the top most surface.

5. A field effect transistor according to claim 2 wherein the material is an InGaAs layer in which the In composition is increased in stages from the bottom portion towards the surface side.

6. A field effect transistor according to claim 2 wherein the material is an InGaAs layer in which the In composition is increased in stages from the bottom portion towards the surface side and wherein the In composition is again lowered in a vicinity of the top most surface.

7. A field effect transistor, comprising:
   a substrate;
   an active layer disposed on said substrate;
   a gate electrode formed on said active layer;
   a contact resistance reducing cap layer with a recess profile formed on a portion of the active layer excluding the gate electrode, wherein the recess profile of the contact resistance reducing cap layer between the source and drain electrodes is the profile in which both the drain side and the recess side compose part of an arc with a radial point of said arc set above the cap layer, and wherein the curvature radius of the arc of the recess profile on a drain side is larger than the curvature radius of the recess profile on a source side; and
   a source electrode and a drain electrode formed on said contact resistance reducing cap layer at respective source and drain sides.

* * * * *